(12) United States Patent
Tanaka et al.

(10) Patent No.: US 8,947,635 B2
(45) Date of Patent: Feb. 3, 2015

(54) ILLUMINATION OPTICAL SYSTEM, EXPOSURE APPARATUS, AND DEVICE MANUFACTURING METHOD

(75) Inventors: Hirohisa Tanaka, Kumagaya (JP); Yasushi Mizuno, Saitama (JP)

(73) Assignee: Nikon Corporation, Tokyo (JP)

( * ) Notice: Subject to any disclaimer, the term of this patent is extended or adjusted under 35 U.S.C. 154(b) by 379 days.

(21) Appl. No.: 13/168,068

(22) Filed: Jun. 24, 2011

(65) Prior Publication Data

US 2012/0015306 A1     Jan. 19, 2012

Related U.S. Application Data

(63) Continuation of application No. PCT/JP2009/067340, filed on Oct. 5, 2009.

(60) Provisional application No. 61/193,802, filed on Dec. 24, 2008.

(51) Int. Cl.
| G03B 27/72 | (2006.01) |
| G02B 27/09 | (2006.01) |
| G03F 7/20 | (2006.01) |

(52) U.S. Cl.
CPC ........ G02B 27/0966 (2013.01); G03F 7/70091 (2013.01); G03F 7/70191 (2013.01)
USPC .......................................................... 355/71

(58) Field of Classification Search
USPC ................................................ 355/53, 67, 71
See application file for complete search history.

(56) References Cited

U.S. PATENT DOCUMENTS

| 7,798,676 | B2 | 9/2010 | Maul et al. | |
| 2003/0038225 | A1 | 2/2003 | Mulder et al. | |
| 2004/0032576 | A1* | 2/2004 | Kondo | 355/53 |
| 2006/0050261 | A1* | 3/2006 | Brotsack | 355/71 |
| 2006/0055834 | A1 | 3/2006 | Tanitsu et al. | |
| 2006/0077371 | A1* | 4/2006 | Wegmann et al. | 355/67 |
| 2006/0170901 | A1 | 8/2006 | Tanitsu et al. | |
| 2006/0268251 | A1* | 11/2006 | Deguenther et al. | 355/67 |
| 2007/0146676 | A1 | 6/2007 | Tanitsu et al. | |
| 2007/0296936 | A1 | 12/2007 | Kato et al. | |
| 2008/0030707 | A1* | 2/2008 | Tanaka et al. | 355/67 |

(Continued)

FOREIGN PATENT DOCUMENTS

| JP | 06-124873 | 5/1994 |
| JP | 09-190969 | 7/1997 |

(Continued)

OTHER PUBLICATIONS

International Search Report, mailed Dec. 28, 2009.

*Primary Examiner* — Toan Ton
*Assistant Examiner* — Deoram Persaud

(57) ABSTRACT

According to one embodiment, an illumination optical system is provided with an optical integrator which forms a predetermined light intensity distribution on an illumination pupil plane in an illumination optical path of the illumination optical system with incidence of exposure light from a light source device thereinto; a transmission filter arranged on the reticle side with respect to the optical integrator and in a first adjustment region set including the illumination pupil plane in an optical-axis direction of the illumination optical system, and having a transmittance characteristic varying according to positions of the exposure light incident thereinto; and a movement mechanism which moves the transmission filter along the optical-axis direction in the first adjustment region.

33 Claims, 17 Drawing Sheets

(56) References Cited

U.S. PATENT DOCUMENTS

| | | | |
|---|---|---|---|
| 2009/0323043 A1* | 12/2009 | Dieckmann et al. | 355/71 |
| 2012/0013877 A1* | 1/2012 | Tanaka et al. | 355/67 |

FOREIGN PATENT DOCUMENTS

| | | |
|---|---|---|
| JP | 10-303114 | 11/1998 |
| JP | 2002-353105 | 12/2002 |
| JP | 2003-092253 | 3/2003 |
| JP | 2003-0243276 | 8/2003 |
| JP | 2004-304135 | 10/2004 |
| JP | 2006-054328 | 2/2006 |
| JP | 2006-059834 | 3/2006 |
| WO | WO 99/49504 | 9/1999 |
| WO | WO 03/023832 A1 | 3/2003 |
| WO | WO 2006/066638 A1 | 6/2006 |
| WO | WO 2008/092653 A2 | 8/2008 |

* cited by examiner

ILLUMINATION OPTICAL SYSTEM, EXPOSURE APPARATUS, AND DEVICE MANUFACTURING METHOD

CROSS-REFERENCE TO RELATED APPLICATION

This application is a continuation application of PCT/JP2009/067340 filed Oct. 5, 2009 claiming the benefit of priority of the U.S. Provisional Application No. 61/193,802 filed on Dec. 24, 2008, the entire contents of which are incorporated herein by reference.

BACKGROUND

1. Field

One embodiment of the invention relates to an illumination optical system, an exposure apparatus provided with the illumination optical system, and a device manufacturing method using the exposure apparatus.

2. Description of the Related Art

In general, an exposure apparatus for manufacturing microdevices such as semiconductor integrated circuits is provided with an illumination optical system for guiding exposure light emitted from a light source, to a mask such as a reticle on which a predetermined pattern is formed. The illumination optical system is provided with a fly's eye lens as an optical integrator. When the exposure light is incident into the fly's eye lens, a predetermined light intensity distribution is formed on an illumination pupil plane which is optically in a Fourier transform relation with an illumination target surface of a mask on the exit plane side of the fly's eye lens (the predetermined light intensity distribution will be referred to hereinafter as "pupil intensity distribution"). The illumination pupil plane on which the pupil intensity distribution is formed is also referred to as a secondary light source consisting of a large number of illuminants.

The exposure light emitted from the secondary light source is condensed by a condenser lens and thereafter illuminates the mask in a superimposed manner. Then the exposure light passing through the mask travels through a projection optical system to illuminate a region on a substrate such as a wafer coated with a photosensitive material. As a result, the pattern of the mask is projected for exposure (or transferred) onto the substrate.

Incidentally, integration (micronization) of the pattern formed on the mask has been becoming higher and higher in recent years. For accurately transferring the microscopic pattern of the mask onto the substrate, it is essential to form an illumination region with a uniform illuminance distribution (which will also be referred to as "still exposure region") on the substrate. A conventional technology for accurately transferring the microscopic pattern of the mask onto the substrate was to form the pupil intensity distribution, for example, of an annular shape or a multi-polar shape (dipolar, quadrupolar, or other shape) on the illumination pupil plane so as to improve the depth of focus and the resolving power of the projection optical system.

SUMMARY

According to one embodiment, an illumination optical system for illuminating an illumination target surface with light from a light source, comprising:

an optical integrator which forms a predetermined light intensity distribution on an illumination pupil plane in an illumination optical path of the illumination optical system with incidence of the light from the light source thereinto;

a transmission filter which is arranged on the illumination pupil plane side with respect to the optical integrator and in at least one region out of a first adjustment region set including the illumination pupil plane in an optical-axis direction of the illumination optical system and a second adjustment region set including a pupil conjugate plane optically conjugate with the illumination pupil plane, and having a transmittance characteristic varying according to positions of the light incident thereinto; and a movement mechanism which moves the transmission filter along the optical-axis direction in said at least one region.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments will be described hereinafter with reference to the accompanying drawings.

First Embodiment

The first embodiment will be described below on the basis of FIGS. 1-3, 4A-4B, 5-6, 7A-7B, and 8-13. In the present embodiment, the Z-axis direction is defined as an optical axis of a below-described projection optical system 15 (the vertical direction in FIG. 1), the Y-axis direction as the horizontal direction in FIG. 1, and the X-axis direction as a direction perpendicular to the plane of FIG. 1.

Figure 1:
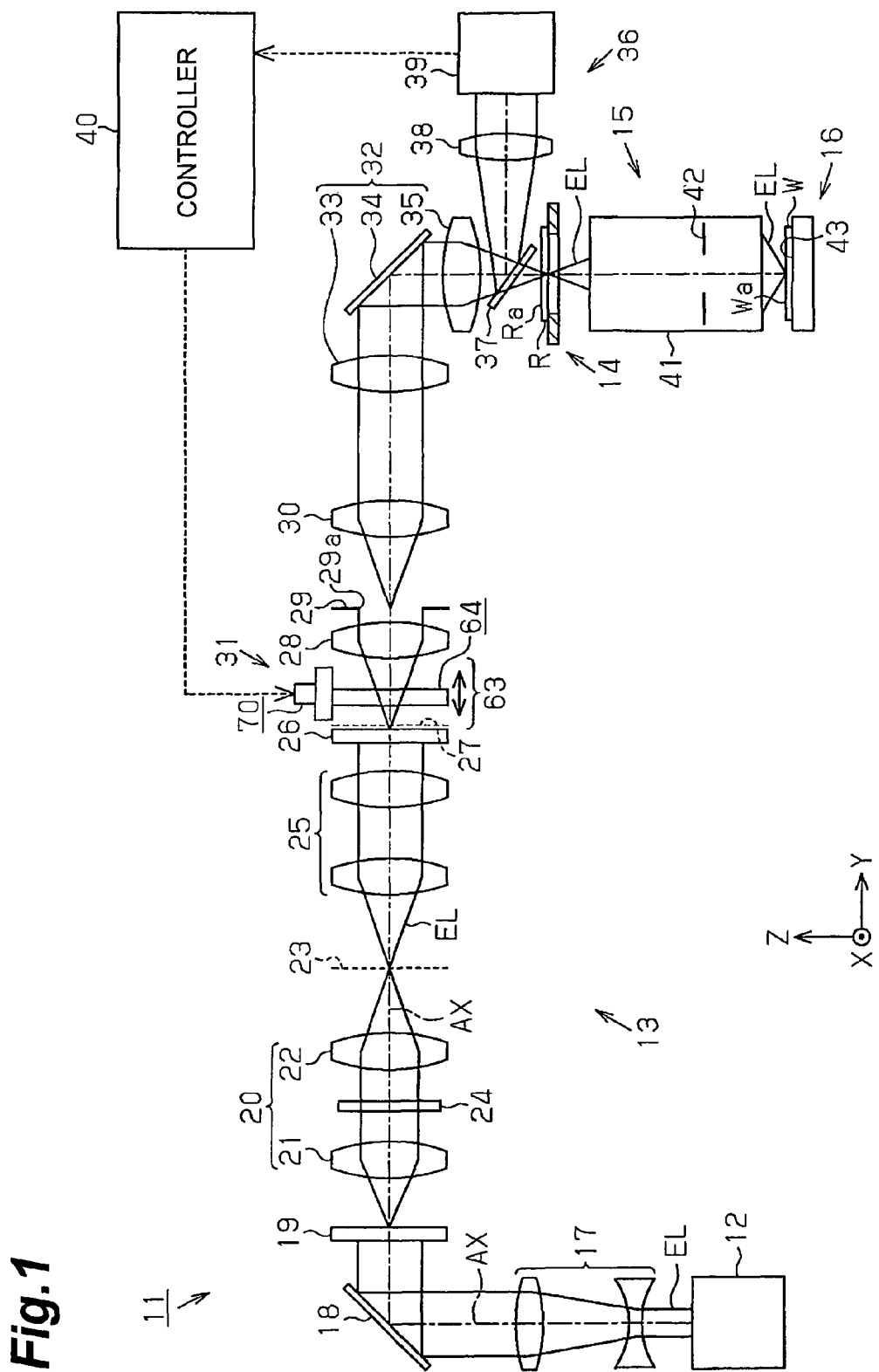
FIG. 1 is an exemplary schematic configuration diagram showing an exposure apparatus in the first embodiment.

As shown in FIG. 1, an exposure apparatus 11 of the present embodiment is a device for projecting an image of a circuit pattern onto a wafer W a surface Wa (which is a surface on the +Z-directional side and the top surface in FIG. 1) of which is coated with a photosensitive material such as a resist, while illuminating a transmission type reticle R with the predetermined circuit pattern formed thereon, with exposure light EL. This exposure apparatus 11 is provided with an illumination optical system 13 which guides the exposure light EL emitted from a light source device 12, to an illumination target surface Ra (surface on the +Z-directional side) of the reticle R, a reticle stage 14 holding the reticle R, a projection optical system 15 which guides the exposure light EL passing through the reticle R, to the surface Wa of the wafer W, and a wafer stage 16 holding the wafer W. The light source device 12 in the present embodiment has an ArF excimer laser light source to output light at the wavelength of 193 nm and a beam emitted from the ArF excimer laser light source is guided as the exposure light EL into the exposure apparatus 11.

The illumination optical system 13 is provided with a shaping optical system 17 for converting the exposure light EL emitted from the light source device 12, into a parallel beam of a predetermined sectional shape (e.g., a nearly rectangular cross section), and a first reflecting mirror 18 which reflects the exposure light EL emitted from the shaping optical system 17, to the reticle R side (the +Y-directional side and the right side in FIG. 1). A diffraction optical element 19 is provided on the exit side (reticle R side) of this first reflecting mirror 18. This diffraction optical element 19 is constructed by forming a plurality of steps having the pitch nearly equal to the wavelength of the exposure light EL, in a glass substrate and has an action to diffract the exposure light EL incident from the entrance side (light source device 12 side), at predetermined angles. For example, in a case where the diffraction optical element 19 is one for annular illumination, when the exposure light EL is incident as a parallel beam of a nearly rectangular cross section from the entrance side into the diffraction optical element 19, the diffraction optical element 19 emits a beam of an annular (nearly ring-like) sectional shape to the reticle R side. In a case where the diffraction optical element 19 is one for multi-polar (dipolar, quadrupolar, octupolar, or other) illumination, when the exposure light EL is incident as a parallel beam of a nearly rectangular cross section from the entrance side into the diffraction optical element 19, the diffraction optical element 19 emits a plurality of (e.g., four) beams according to the number of poles, to the reticle R side.

The illumination optical system 13 is provided with an afocal optical system 20 into which the exposure light EL emitted from the diffraction optical element 19 is incident (which is also called "afocal optic"). This afocal optical system 20 has a first lens unit 21 (only one lens of which is illustrated in FIG. 1), and a second lens unit 22 disposed on the exit side with respect to the first lens unit 21 (only one lens of which is illustrated in FIG. 1). The afocal optical system 20 is formed in such a manner that the entrance-side focal position of the afocal optical system 20 is approximately coincident with the installation position of the diffraction optical element 19 and that the exit-side focal position of the afocal optical system 20 is approximately coincident with a position of a predetermined plane 23 indicated by a dashed line in FIG. 1.

In the optical path between the first lens unit 21 and the second lens unit 22, a correction filter 24 having a transmittance distribution of different transmittances according to positions of incidence of the exposure light EL is provided at or near a position optically conjugate with an illumination pupil plane 27 of a below-described optical integrator 26. This correction filter 24 is a filter obtained by forming a pattern of light-blocking dots comprised of chromium or chromium oxide on a glass substrate having an entrance plane and an exit plane parallel to each other.

A zoom optical system 25 for varying the σ value (σ value=numerical aperture on the reticle R side of the illumination optical system 13/numerical aperture on the reticle R side of the projection optical system 15) is provided on the reticle R side of the afocal optical system 20 and the zoom optical system 25 is arranged on the exit side with respect to the predetermined plane 23. The exposure light EL to be emitted from the zoom optical system 25 is converted into a parallel beam by the zoom optical system 25 and thereafter the parallel beam is incident into the optical integrator 26 arranged on the exit side of the zoom optical system 25. Then the optical integrator 26 divides the wavefront of the incident exposure light EL into a plurality of beams and forms a predetermined light intensity distribution (also referred to as "pupil intensity distribution") on the illumination pupil plane 27 located on the exit side (+Y-directional side) thereof. The illumination pupil plane 27 on which the pupil intensity distribution is formed is also referred to as a secondary light source 60 consisting of a large number of surface illuminants (cf. FIG. 3).

The optical integrator 26 is arranged in such a manner that an entrance plane thereof (a plane on the −Y-directional side and the left plane in FIG. 1) is located at or near the exit-side focal position (also referred to as a pupil plane) of the zoom optical system 25. Namely, the predetermined plane 23 and the entrance plane of the optical integrator 26 are substantially in a Fourier transform relation and the pupil plane of the afocal optical system 20 (i.e., the installation position of the correction filter 24) and the entrance plane of the optical integrator 26 are substantially in an optically conjugate relation.

On the exit side of the optical integrator 26, there is an unshown illumination aperture stop, which is arranged at a position substantially optically conjugate with an entrance pupil plane of the projection optical system 15 and which is provided for defining a range of contribution of the secondary light source 60 to illumination. This illumination aperture stop has a plurality of aperture portions of different sizes and shapes. In the illumination aperture stop, an aperture portion corresponding to the cross-sectional shape of the exposure light EL emitted from the secondary light source 60 is located in the optical path of the exposure light EL. Specifically, in a case where the cross-sectional shape of the exposure light EL emitted from the secondary light source 60 is annular, the illumination aperture stop is driven so as to locate the aperture portion of the shape corresponding to the annular shape in the optical path of the exposure light EL. In a case where the cross-sectional shape of the exposure light EL emitted from the secondary light source 60 is quadrupolar, the illumination aperture stop is driven so as to locate the aperture portion of the shape corresponding to the quadrupolar shape in the optical path of the exposure light EL.

On the exit side of the optical integrator 26 and the illumination aperture stop, there is a distribution correction optical system 31 provided for correcting light intensity distributions at respective points in an illumination region ER1 (cf. FIG. 4A) formed on the reticle R and in a still exposure region ER2 (cf. FIG. 4B) formed on the wafer W being in an optically conjugate relation with the illumination region ER1. A specific configuration of the distribution correction optical system 31 will be described later.

On the exit side of the distribution correction optical system 31, there are a first condenser optical system 28 composed of at least one lens (only one lens of which is illustrated in FIG. 1), and a reticle blind 29 (also referred to as "mask blind") arranged on the exit side of the first condenser optical system 28 and at a position optically conjugate with the illumination target surface Ra of the reticle R. The first condenser optical system 28 is composed of an optical element (lens) having a power (inverse of focal length). A rectangular aperture 29a having the longitudinal direction along the Z-axis direction and the transverse direction along the X-axis direction is formed in the reticle blind 29. The exposure light EL emitted from the first condenser optical system 28 illuminates the reticle blind 29 in a superimposed manner. The optical element having the power herein refers to an optical element that varies a property of the exposure light EL with incidence of the exposure light EL into the optical element.

Figure 4A:
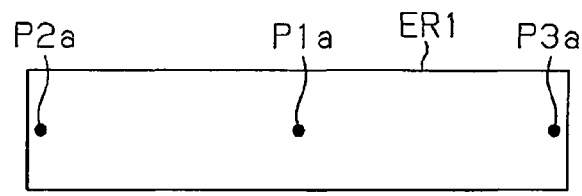
FIG. 4A is an exemplary schematic diagram showing an illumination region formed on a reticle and FIG. 4B is an exemplary schematic diagram showing a still exposure region formed on a wafer.
Figure 4B:
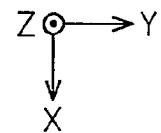
Figure 4B:
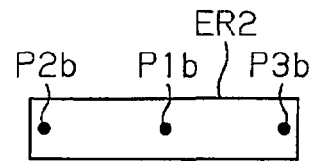

A second condenser optical system 30 composed of a lens having a power is provided on the exit side of the reticle blind 29, and the second condenser optical system 30 converts the light incident from the reticle blind 29 side into a nearly parallel beam. On the exit side of the second condenser optical system 30, there is an imaging optical system 32 provided. This imaging optical system 32 is provided with an entrance-side lens unit 33, a second reflecting mirror 34 which reflects the exposure light EL emitted from the entrance-side lens unit 33, to the −Z-directional side (the lower side in FIG. 1), and an exit-side lens unit 35 disposed on the exit side of the second reflecting mirror 34. The entrance-side lens unit 33 is composed of at least one optical element (lens) having a power (only one optical element of which is illustrated in FIG. 1) and the exit-side lens unit 35 is composed of at least one optical element (lens) having a power (only one optical element of which is illustrated in FIG. 1). Then the exposure light EL emitted from the imaging optical system 32 illuminates the illumination target surface Ra of the reticle R in a superimposed manner. In the present embodiment, the shape of the aperture 29a of the reticle blind 29 is rectangular as described above. For this reason, the illumination region ER1 on the reticle R and the still exposure region ER2 on the wafer W are formed, as shown in FIGS. 4A and 4B, each in a rectangular shape having the longitudinal direction along the Y-axis direction as a first direction and the transverse direction along the X-axis direction as a second direction.

The reticle stage 14 is arranged, as shown in FIG. 1, in such a manner that a mounting surface thereof for the reticle R is approximately perpendicular to the optical-axis direction (Z-axis direction) of the projection optical system 15, on the object plane side of the projection optical system 15. The reticle stage 14 is provided with an unillustrated reticle stage driving unit for moving the reticle R held thereon, in a predetermined stroke in the X-axis direction.

A pupil intensity distribution measuring device 36 is provided near the reticle stage 14. This pupil intensity distribution measuring device 36 is a device that measures a pupil intensity distribution formed by incident beams entering a point in the illumination region ER1 on the reticle R, in the secondary light source 60, for each point (or for each position). The pupil intensity distribution measuring device 36 is provided with a beam splitter 37 for reflecting part of the exposure light EL (the part will also be referred to as "reflected light") emitted from the exit-side lens unit 35 toward the reticle R, a measurement lens 38 into which the reflected light from the beam splitter 37 is incident, and a detection unit 39 into which the reflected light from the measurement lens 38 is incident. This detection unit 39 has a CCD imaging device, a photodiode, or the like and the detection unit 39 outputs a detection signal according to the incident reflected light to a control unit 40. The control unit 40 derives the pupil intensity distribution for each point in the illumination region ER1, based on the detection signal from the detection unit 39. The pupil intensity distribution measuring device 36 is disclosed, for example, in Japanese Patent Application Laid-Open No. 2006-54328 and U.S. Patent Application Laid-Open No. 2003/0038225.

The projection optical system 15 is provided with a lens barrel 41 filled inside with an inert gas such as nitrogen and a plurality of lenses not shown are provided along the optical path (Z-axis direction) of the exposure light EL in the lens barrel 41. In the lens barrel 41, an aperture stop 42 is arranged at a position in an optical Fourier transform relation with the installation position of the surface Wa of the wafer W and the installation position of the illumination target surface Ra of the reticle R. Then an image of the circuit pattern on the reticle R illuminated with the exposure light EL is projected and transferred to the wafer W on the wafer stage 16, as demagnified at a predetermined reduction ratio through the projection optical system 15. The optical path herein refers to a passage in which the exposure light EL is intended to pass in an operating state.

The wafer stage 16 is provided with a planar mounting surface 43 approximately perpendicular to the optical axis of the projection optical system 15 and the wafer W is mounted on the mounting surface 43. In addition, the wafer stage 16 is provided with an unillustrated wafer stage driving unit for moving the wafer W held thereon, in a predetermined stroke in the X-axis direction. Furthermore, the wafer stage 16 is provided with a mechanism for finely adjusting the position of the wafer W so that the surface Wa of the wafer W becomes perpendicular to the optical axis of the projection optical system 15.

When the image of the pattern is projected onto the wafer W, using the exposure apparatus 11 of the present embodiment, the reticle R is driven by the aforementioned reticle stage driving unit so as to move in the predetermined stroke from the +X-directional side to the −X-directional side (from the near side to the far side with respect to the plane of FIG. 1). Then the illumination region ER1 on the reticle R moves along the direction from the −X-directional side to the +X-directional side (from the far side to the near side with respect to the plane of FIG. 1) of the illumination target surface Ra of the reticle R. Namely, the pattern of the reticle R scans in order from the −X-directional side to the +X-directional side. The wafer W is driven by the aforementioned wafer stage driving unit so as to move at a speed ratio according the demagnification ratio of the projection optical system 15 from the −X-directional side to the +X-directional side in synchronism with the movement along the X-axis direction of the reticle R. As a result, a pattern of a shape resulting from demagnification of the circuit pattern on the reticle R at the predetermined demagnification ratio is formed in one shot area on the wafer W, with the synchronous movement of the reticle R and the wafer W. After completion of the formation of the pattern in one shot area, the formation of the pattern is sequentially carried out in another shot area on the wafer W.

The optical integrator 26 in the present embodiment will be described below on the basis of FIG. 2. It should be noted that in FIG. 2 the size of each of below-described cylindrical lens faces 52, 53, 54, 55 is exaggeratingly illustrated for convenience' sake of description and understanding of the specification.

Figure 2:
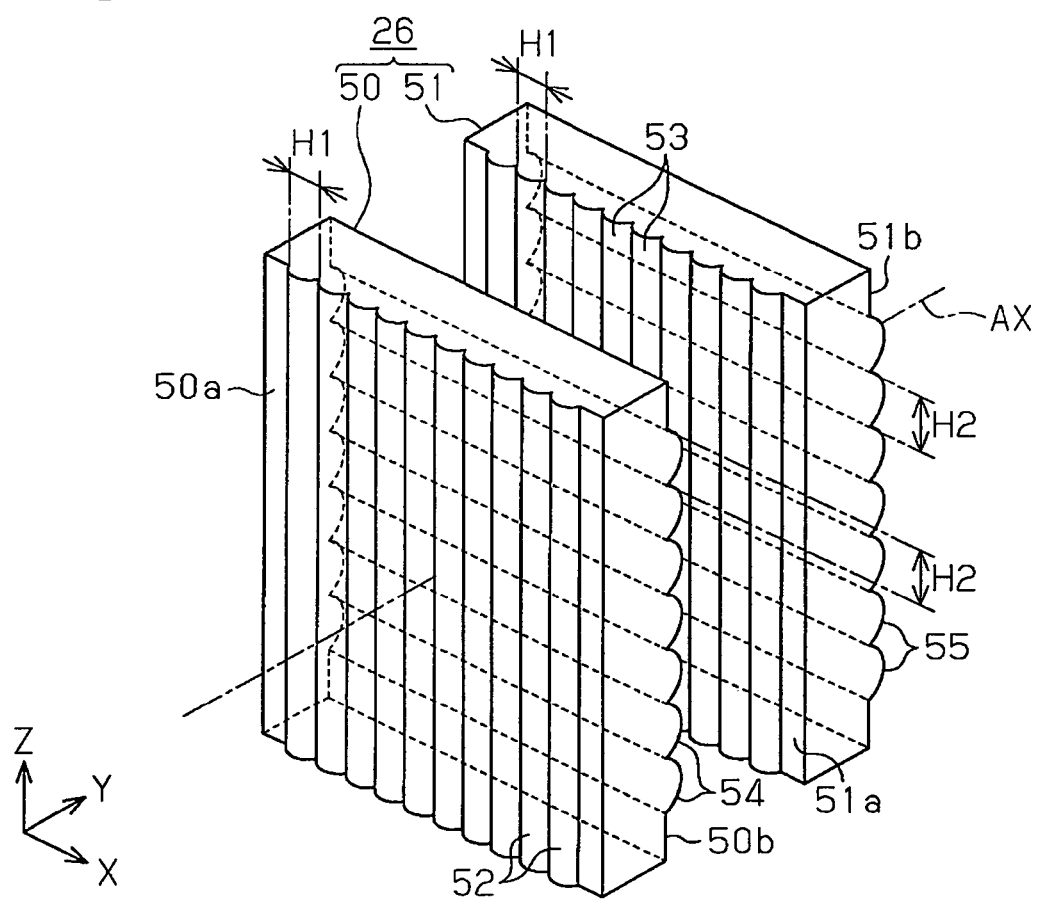
FIG. 2 is an exemplary perspective view schematically showing a pair of micro fly's eye lenses.

As shown in FIG. 2, the optical integrator 26 is provided with a pair of micro fly's eye lenses 50, 51 arranged along the optical axis AX of the illumination optical system 13 (which is indicated by a chain line in FIGS. 1 and 2). These micro fly's eye lenses 50, 51 each are arranged so that the illumination pupil plane 27 located on the exit side of the optical integrator 26 is formed at a position optically conjugate with the aperture stop 42 of the projection optical system 15.

Entrance surfaces 50a, 51a approximately perpendicular to the optical axis AX of the illumination optical system 13 are formed on the entrance side of the first micro fly's eye lens 50 located on the entrance side and on the entrance side of the second micro fly's eye lens 51 located on the exit side, respectively. Furthermore, exit surfaces 50b, 51b approximately perpendicular to the optical axis AX of the illumination optical system 13 are formed on the exit side of the first micro fly's eye lens 50 and on the exit side of the second micro fly's eye lens 51, respectively. A plurality of (ten in FIG. 2) cylindrical lens faces 52, 53 extending in the Z-axis direction are arrayed along the X-axis direction on the entrance surface 50a, 51a side of the two micro fly's eye lenses 50, 51, respectively. Each of these cylindrical lens faces 52, 53 is formed in a shape obtained by cutting off a part of a circular cylinder and a length in the X-axis direction of each cylindrical lens face 52, 53 (i.e., the width) is a first width H1.

A plurality of (ten in FIG. 2) cylindrical lens faces 54, 55 extending in the X-axis direction are arrayed along the Z-axis direction on the exit surface 50b, 51b side of the two micro fly's eye lenses 50, 51, respectively. Each of these cylindrical lens faces 54, 55 is formed in a shape obtained by cutting off a part of a circular cylinder and a length in the Z-axis direction of each cylindrical lens face 54, 55 (i.e., the width) is a second width H2 larger than the first width H1. The first width H1 and the second width H2 each have a correspondence relation with the length in the X-axis direction and the length in the Z-axis direction of the aperture 29a of the reticle blind 29, i.e., with the lengths in the X-axis direction and the lengths in the Y-axis direction of the illumination region ER1 and the still exposure region ER2.

When attention is focused on the refracting action in the X-axis direction of the optical integrator 26, the exposure light EL (i.e., the parallel beam) incident along the optical axis AX of the illumination optical system 13 undergoes wavefront division at intervals of the first width H1 along the X-axis direction by the respective cylindrical lens faces 52 formed in the entrance surface 50a of the first micro fly's eye lens 50. Then beams resulting from the wavefront division by the respective cylindrical lens faces 52 are subjected to focusing action by individually corresponding cylindrical lens faces out of the cylindrical lens faces 53 formed in the entrance surface 51a of the second micro fly's eye lens 51 and thereafter are focused each on the illumination pupil plane 27 located on the exit side of the optical integrator 26. When attention is focused on the refracting action in the Z-axis direction of the optical integrator 26, the exposure light EL (i.e., the parallel beam) incident along the optical axis AX of the illumination optical system 13 undergoes wavefront division at intervals of the second width H2 along the Z-axis direction by the respective cylindrical lens faces 54 formed in the exit surface 50b of the first micro fly's eye lens 50. Then beams resulting from the wavefront division by the respective cylindrical lens faces 54 are subjected to focusing action by individually corresponding cylindrical lens faces out of the cylindrical lens faces 55 formed in the exit surface 51b of the second micro fly's eye lens 51 and thereafter are focused each on the illumination pupil plane 27 located on the exit side of the optical integrator 26. From a large number of point light sources (not shown) formed on the illumination pupil plane 27, beams of exposure light EL are emitted with a divergence angle corresponding to the Z-axis direction larger than that corresponding to the X-axis direction because of the magnitudes of the widths H1, H2 of the cylindrical lens faces 52-55 and the arrangement positions of the cylindrical lens faces 52-55 in the Y-axis direction. Namely, the beams of exposure light EL emitted from the illumination pupil plane 27 have the spread along the Z-axis direction larger than the spread along the X-axis direction.

The first width H1 and the second width H2 of the cylindrical lens faces 52-55 of the micro fly's eye lenses 50, 51 are originally very small. For this reason, the number of wavefront divisions in the optical integrator 26 of the present embodiment is larger than in cases using a fly's eye lens composed of a plurality of lens elements. As a result, a high correlation is exhibited between a global light intensity distribution formed on the entrance side of the optical integrator 26 and a global light intensity distribution of the entire secondary light source formed on the illumination pupil plane 27 on the exit side. Therefore, the light intensity distributions on the entrance side of the optical integrator 26 and on a plane optically conjugate with the entrance side can also be called pupil intensity distributions.

In the case where the diffraction optical element 19 is a diffraction optical element for annular illumination, an illumination field of an annular shape centered on the optical axis AX of the illumination optical system 13 is formed on the entrance side of the optical integrator 26. As a result, the secondary light source 60 of an annular shape, which is the same as the annular illumination field formed on the entrance side, is formed on the illumination pupil plane 27 located on the exit side of the optical integrator 26. In the case where the diffraction optical element 19 is a diffraction optical element for multi-polar illumination, an illumination field of a multi-polar shape consisting of a plurality of illumination zones of a predetermined shape (arcuate, circular, or other shape) centered on the optical axis AX of the illumination optical system 13 is formed on the entrance side of the optical integrator 26. As a result, the secondary light source 60 of a multi-polar shape, which is the same as the multi-polar illumination field formed on the entrance side, is formed on the illumination pupil plane 27 located on the exit side of the optical integrator 26. It is assumed that the present embodiment employs the diffraction optical element 19 for quadrupolar illumination.

Figure 3:
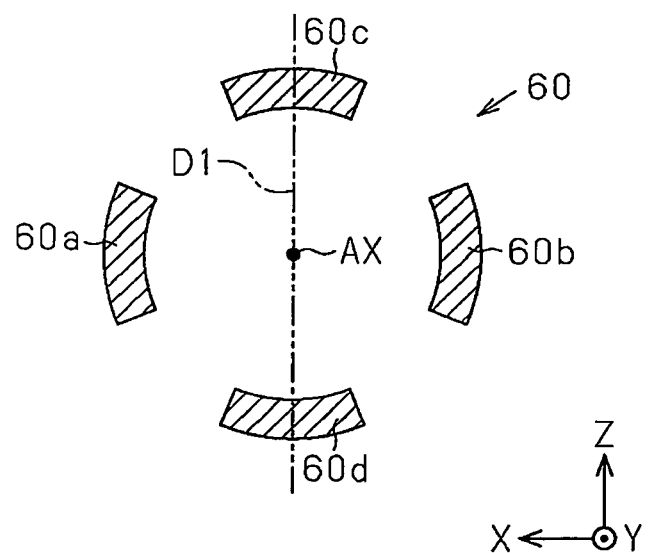
FIG. 3 is an exemplary schematic diagram showing a secondary light source of a circular shape formed on an illumination pupil plane.

Namely, as shown in FIG. 3, the quadrupolar secondary light source 60 (pupil intensity distribution) consisting of four arcuate substantial surface illuminants (hereinafter referred to simply as "surface illuminants") 60a, 60b, 60c, 60d is formed on the illumination pupil plane 27 located on the exit side of the optical integrator 26. Specifically, the secondary light source 60 has a first surface illuminant 60a of the arcuate shape located on the +X-directional side with respect to the optical axis AX of the illumination optical system 13, and a second surface illuminant 60b of the arcuate shape located on the −X-directional side with respect to the optical axis AX of the illumination optical system 13, and an imaginary division plane D1 including the optical axis AX of the illumination optical system 13 (which is the Y-Z plane in the present embodiment and is indicated by a chain double-dashed line in FIG. 3) is located at a middle position between the surface illuminants 60a, 60b. The secondary light source 60 further has a third surface illuminant 60c of the arcuate shape located on the +Z-directional side with respect to the optical axis AX of the illumination optical system 13 and a fourth surface illuminant 60d of the arcuate shape located on the −Z-directional side with respect to the optical axis AX of the illumination optical system 13, and an unshown imaginary division plane including the optical axis AX of the illumination optical system 13 (which is the X-Y plane in the present embodiment) is located at a middle position between the surface illuminants 60c, 60d.

Beams of exposure light EL emitted from the respective surface illuminants 60a-60d are guided onto the reticle R, whereby the illumination region ER1 having the longitudinal direction along the Y-axis direction and the transverse direction along the X-axis direction is formed, as shown in FIG. 4A, on the illumination target surface Ra of the reticle R. The still exposure region ER2 of the rectangular shape corresponding to the illumination region ER1 on the reticle R is formed, as shown in FIG. 4B, on the surface Wa of the wafer W. On this occasion, quadrupolar pupil intensity distributions formed by incident beams incident to respective points in the still exposure region ER2 (and the illumination region ER1) have the same shape, independent of positions of incidence of the exposure light EL. However, light intensities of the quadrupolar pupil intensity distributions at respective points in the still exposure region ER2 (and the illumination region ER1) tend to be different depending on positions of the exposure light EL incident into the still exposure region ER2.

Figure 5:
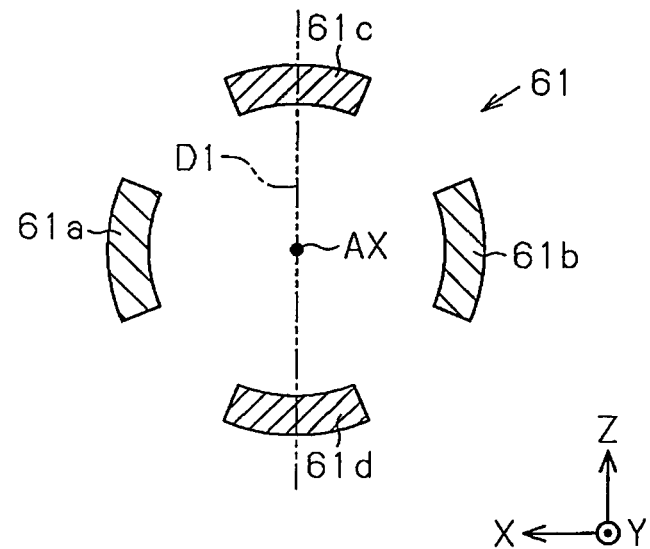
FIG. 5 is an exemplary schematic diagram showing a first pupil intensity distribution formed by incident light beams to enter a center point in the still exposure region.
Figure 6:
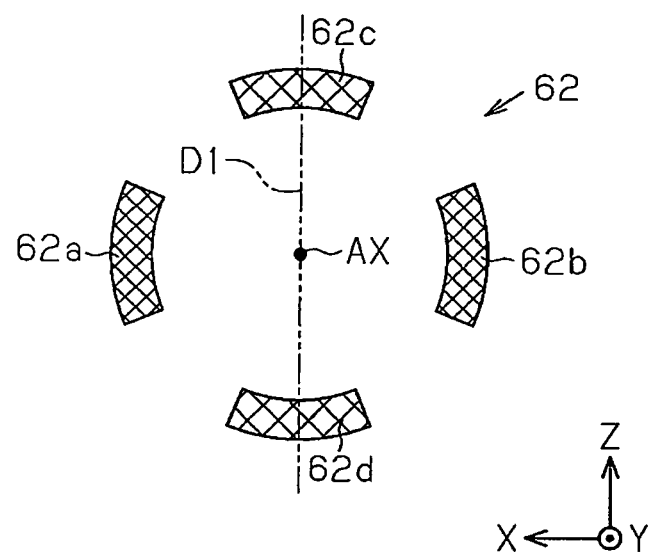
FIG. 6 is an exemplary schematic diagram showing a second pupil intensity distribution formed by incident light beams to enter peripheral points in the still exposure region.

Specifically, in the case of a first pupil intensity distribution 61 formed by first incident light EL1 (cf. FIG. 8) incident to center points P1a, P1b in the Y-axis direction in the illumination region ER1 and in the still exposure region ER2, as shown in FIG. 5, the light intensity of the third surface illuminant 61c and the fourth surface illuminant 61d arranged along the Z-axis direction tends to be stronger than the light intensity of the first surface illuminant 61a and the second surface illuminant 61b arranged along the X-axis direction. On the other hand, in the case of a second pupil intensity distribution 62 formed by second incident light EL2 and third incident light EL3 (cf. FIG. 8) incident to peripheral points P2a, P3a, P2b, P3b spaced along the Y-axis direction with respect to the center points P1a, P1b in the illumination region ER1 and in the still exposure region ER2, as shown in FIGS. 4A, 4B, and 6, the light intensity of the third surface illuminant 62c and the fourth surface illuminant 62d arranged along the Z-axis direction tends to be weaker than the light intensity of the first surface illuminant 62a and the second surface illuminant 62b arranged along the X-axis direction. The pupil intensity distributions 61, 62 stated herein refer to light intensity distributions corresponding to the respective points P1b, P2b, P3b in the still exposure region ER2, which are formed on the illumination pupil plane 27 and on a pupil conjugate plane optically conjugate with the illumination pupil plane 27, in a state in which the correction filter 24 and below-described transmission filter 64 are not arranged in the optical path of the exposure light EL in the illumination optical system 13.

Figure 7A:
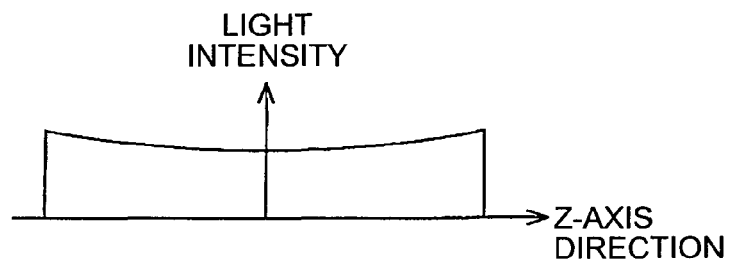
FIG. 7A is an exemplary graph showing light intensities along the Z-axis direction of the first pupil intensity distribution corresponding to the center point in the still exposure region and FIG. 7B is an exemplary graph showing light intensities along the Z-axis direction of the second pupil intensity distribution corresponding to the peripheral points in the still exposure region.
Figure 7B:
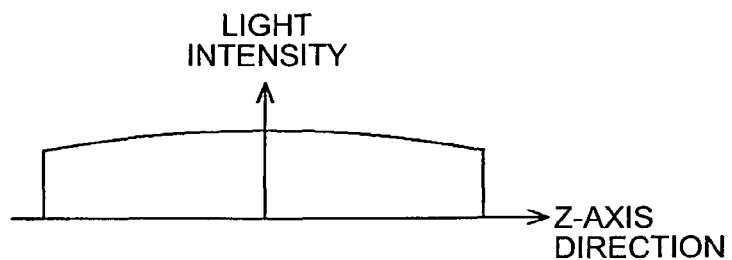

In general, a light intensity profile along the Z-axis direction of the first pupil intensity distribution 61 corresponding to the center points P1a, P1b is, as shown in FIG. 7A, a concave curved profile in which the light intensity is the weakest at the center in the Z-axis direction and gradually increases with distance from the center along the Z-axis direction. A light intensity profile along the Z-axis direction of the second pupil intensity distribution 62 corresponding to each peripheral point P2a, P2b, P3a, P3b is, as shown in FIG. 7B, a convex curved profile in which the light intensity is the strongest at the center in the Z-axis direction and gradually decreases with distance from the center along the Z-axis direction.

Such light intensity profiles along the Z-axis direction of the pupil intensity distributions 61, 62 have little dependence on positions of respective points along the X-axis direction in the illumination region ER1 and the still exposure region ER2, but tend to vary depending upon positions of respective points along the Y-axis direction in the illumination region ER1 and the still exposure region ER2. For this reason, when the pupil intensity distributions 61, 62 individually corresponding to the respective points P1b, P2b, P3b along the Y-axis direction in the still exposure region ER2 are not uniform, there is a risk of occurrence of variation in the line width of the pattern formed on the wafer W. For solving this problem, the correction filter 24 and distribution correction optical system 31 are provided in the illumination optical system 13 of the present embodiment.

The correction filter 24 in the present embodiment has a transmittance distribution to cause extinction of beams forming the third surface illuminant 60c and the fourth surface illuminant 60d along the Z-axis direction of the secondary light source 60 formed on the illumination pupil plane 27 and to cause little extinction of beams forming the first surface illuminant 60a and the second surface illuminant 60b along the X-axis direction.

Figure 8:
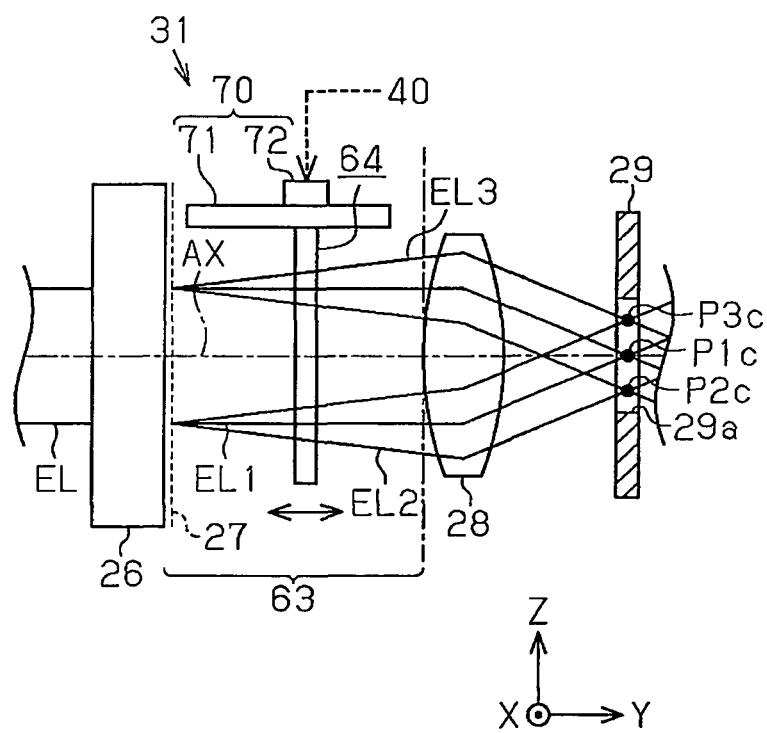
FIG. 8 is an exemplary schematic configuration diagram showing a distribution correction optical system in the first embodiment.

Next, the distribution correction optical system 31 in the present embodiment will be described on the basis of FIGS. 8 and 9. FIG. 8 shows only beams of the exposure light EL emitted from the third surface illuminant 60c and the fourth surface illuminant 60d out of the surface illuminants 60a-60d forming the secondary light source 60. In FIG. 8, a conjugate center point P1c corresponding to the center point P1b in the still exposure region ER2, and conjugate peripheral points P2c, P3c individually corresponding to the respective peripheral points P2b, P3b are shown at the installation position of the reticle blind 29.

As shown in FIG. 8, the distribution correction optical system 31 is provided with a transmission filter 64 arranged in a first adjustment region 63 formed between the optical integrator 26 and the first condenser optical system 28. This transmission filter 64, as shown in FIG. 9, has an optically transparent member 64a to transmit the exposure light EL (a glass plate of a nearly square shape in the present embodiment) and an effective filter region 65 of a nearly circular shape centered on the optical axis AX of the illumination optical system 13 (the region enclosed by a dashed line in FIG. 9) is formed on the optically transparent member 64a.

This effective filter region 65 is divided into a first filter region 65a corresponding to the first surface illuminant 60a, a second filter region 65b corresponding to the second surface illuminant 60b, a third filter region 65c corresponding to the third surface illuminant 60c, and a fourth filter region 65d corresponding to the fourth surface illuminant 60d. Specifically, the filter regions 65a-65d are formed by partitioning the effective filter region 65 by a first line L1 (indicated by a dashed line in FIG. 9) being an imaginary line perpendicular to the optical axis AX of the illumination optical system 13 and a second line L2 (indicated by a dashed line in FIG. 9) being an imaginary line perpendicular to the first line on the optically transparent member 64a. An imaginary division plane D2 (which is a plane indicated by a chain double-dashed line in FIG. 9 and the Y-Z plane) including the optical axis AX of the illumination optical system 13 is located between the first filter region 65a and the second filter region 65b arranged along the X-axis direction out of the filter regions 65a-65d. The beams of exposure light EL emitted from the respective surface illuminants 60a-60d individually corresponding to the respective filter regions 65a-65d are made incident into the respective filter regions 65a-65d.

The third filter region 65c and the fourth filter region 65d out of the filter regions 65a-65d are not subjected to a treatment for extinction of the exposure light EL entering the respective filter regions 65c, 65d. Namely, the beams of exposure light EL emitted from the third surface illuminant 60c and the fourth surface illuminant 60d undergo little extinction even if they pass through the transmission filter 64. On the other hand, a pattern of light-blocking dots comprised of chromium or chromium oxide is formed in each of the remaining first filter region 65a and second filter region 65b, in order to implement extinction of the exposure light EL incident into each of the filter regions 65a, 65b. Specifically, a first transmittance distribution is formed in the first filter region 65a so that the transmittance is the highest in a central region in the Z-axis direction corresponding to the longitudinal direction of the still exposure region ER2 and gradually decreases with distance from the central region in the Z-axis direction. A second transmittance distribution is formed in the second filter region 65b so that the transmittance is the highest in a central region in the Z-axis direction corresponding to the longitudinal direction of the still exposure region ER2 and gradually decreases with distance from the central region in the Z-axis direction. Namely, the first transmittance distribution and the second transmittance distribution are identical to each other. Therefore, the first filter region 65a functions as a first pattern region into which the exposure light EL emitted from the first surface illuminant 60a as a first region of the secondary light source 60 is incident and the second filter region 65b functions as a second pattern region into which the exposure light EL emitted from the second surface illuminant 60b as a second region different from the first surface illuminant 60a in the secondary light source 60 is incident. In FIG. 9, levels of transmittance are illustrated by differences of density of dots, for convenience' sake of description and understanding of the specification.

In passing, each of the surface illuminants 60a-60d of the secondary light source 60 formed on the illumination pupil plane 27 is formed by the beams of exposure light EL to enter the respective points in the still exposure region ER2 on the wafer W. Namely, the first incident beam EL1 in the exposure light EL to enter the center point P1b passes at a first angle (predetermined angle) relative to the optical axis AX of the illumination optical system 13 in each surface illuminant 60a-60d. The second incident beam EL2 in the exposure light EL to enter the peripheral point P2b passes at a second angle (predetermined angle) larger than the first angle relative to the optical axis AX of the illumination optical system 13 in each surface illuminant 60a-60d. The third incident beam EL3 in the exposure light EL to enter the peripheral point P3b passes at a third angle (predetermined angle) nearly equal to the second angle relative to the optical axis AX of the illumination optical system 13 in each surface illuminant 60a-60d.

Then the incident beams EL1-EL3 emitted from a large number of unillustrated point light sources (predetermined points) constituting the first surface illuminant 60a pass each through the first filter region 65a located in the −X-directional side with respect to the division plane D2 in the transmission filter 64. The incident beams EL1-EL3 emitted from a large number of unillustrated point light sources (predetermined points) constituting the second surface illuminant 60b pass each through the second filter region 65b located on the +X-directional side with respect to the division plane D2 in the transmission filter 64. The incident beams EL1-EL3 emitted from a large number of unillustrated point light sources (predetermined points) constituting the third surface illuminant 60c pass each through the third filter region 65c located on the +Z-directional side (the upper side in FIG. 9) in the transmission filter 64. The incident beams EL1-EL3 emitted from a large number of unillustrated point light sources (predetermined points) constituting the fourth surface illuminant 60d pass each through the fourth filter region 65d located on the −Z-directional side (the lower side in FIG. 9) in the transmission filter 64.

As a result, a first incidence region 66 is formed in the first filter region 65a by the exposure light EL emitted from the first surface illuminant 60a and a second incidence region 67 is formed in the second filter region 65b by the exposure light EL emitted from the second surface illuminant 60b. Furthermore, a third incidence region 68 is formed in the third filter region 65c by the exposure light EL emitted from the third surface illuminant 60c and a fourth incidence region 69 is formed in the fourth filter region 65d by the exposure light EL emitted from the fourth surface illuminant 60d. FIG. 9 shows the transmission filter 64 arranged at a position approximately identical in the Y-axis direction with the illumination pupil plane 27.

The distribution correction optical system 31, as shown in FIG. 8, is provided with a movement mechanism 70 for moving the transmission filter 64 along the Y-axis direction. This movement mechanism 70 is provided with a guide portion 71 extending along the Y-axis direction, and a drive source 72 for providing a drive force to the transmission filter 64. The length of the guide portion 71 in the Y-axis direction is set, as shown in FIGS. 9 and 10, so that a ratio of the distance R2 along the X-axis direction between the first incidence region 66 (or the second incidence region 67) and the optical axis AX to the radius R1 of the effective filter region 65 (half of the effective diameter of the effective filter region 65) (which is equal to distance R2/radius R1) exceeds "1/2." The drive source 72 is actuated on the basis of a control command from the control unit 40. When the drive source 72 provides the drive force to the transmission filter 64, the transmission filter 64 moves in the Y-axis direction along the guide portion 71. The distribution correction optical system 31 is provided with an unillustrated reciprocal movement device for reciprocal movement of the transmission filter 64 between two positions inside and outside the optical path of the exposure light EL and the reciprocal movement device is driven in accordance with a control command from the control unit 40.

An example of action in adjustment of the pupil intensity distributions 61, 62 corresponding to the respective points P1b, P2b, P3b along the Y-axis direction in the still exposure region ER2 will be described below on the basis of FIGS. 10 to 13. It is assumed that in an initial state the transmission filter 64 is located outside the optical path of the exposure light EL.

When the exposure light EL emitted from the light source device 12 is incident into the diffraction optical element 19, the diffraction optical element 19 emits the exposure light EL of the quadrupolar sectional shape. Then this exposure light EL passes through the correction filter 24 arranged at or near the position optically conjugate with the illumination pupil plane 27, whereby the secondary light source 60 having the first surface illuminant 60a and the second surface illuminant 60b subjected to correction (extinction) by the correction filter 24 and the third surface illuminant 60c and the fourth surface illuminant 60d subjected to little correction by the correction filter 24 is formed on the illumination pupil plane 27 formed on the exit side of the optical integrator 26. On this occasion, the correction filter 24 also corrects the pupil intensity distribution on the pupil conjugate plane optically conjugate with the illumination pupil plane 27 (e.g., the arrangement position of the reticle blind 29).

The correction filter 24 in the present embodiment is a filter for reducing the light intensity of the third surface illuminant 60c and the fourth surface illuminant 60d along the Z-axis direction of the secondary light source 60 formed on the illumination pupil plane 27. As described above, in the first pupil intensity distribution 61 corresponding to the center points P1a, P1b in the illumination region ER1 on the reticle R and in the still exposure region ER2 on the wafer W, when the correction filter 24 is not located in the optical path of the exposure light EL, the light intensity of the first surface illuminant 61a and the second surface illuminant 61b along the X-axis direction is weaker than the light intensity of the third surface illuminant 61c and the fourth surface illuminant 61d along the Z-axis direction. For this reason, in the first pupil intensity distribution 61, the correction filter 24 makes the light intensity of the third surface illuminant 61c and the fourth surface illuminant 61d approximately equal to the light intensity of the first surface illuminant 61a and the second surface illuminant 61b. On the other hand, in the second pupil intensity distribution 62 corresponding to the peripheral points P2a, P2b, P3a, P3b in the illumination region ER1 and in the still exposure region ER2, when the correction filter 24 is not located in the optical path of the exposure light EL, the light intensity of the first surface illuminant 62a and the second surface illuminant 62b along the X-axis direction is stronger than the light intensity of the third surface illuminant 62c and the fourth surface illuminant 62d along the Z-axis direction. For this reason, in the second pupil intensity distribution 62, the correction filter 24 increases the difference between the light intensity of the first surface illuminant 61a and the second surface illuminant 62b and the light intensity of the third surface illuminant 62c and the fourth surface illuminant 62d on the contrary.

For adjusting the first pupil intensity distribution 61 and the second pupil intensity distribution 62 to distributions with properties substantially identical to each other, it is necessary to slightly reduce the light intensity of the first surface illuminant 61a and the second surface illuminant 61b of the first pupil intensity distribution 61 and largely reduce the light intensity of the first surface illuminant 62a and the second surface illuminant 62b of the second pupil intensity distribution 62. In the present embodiment, therefore, the pupil intensity distribution measuring device 36 measures the light intensity of the quadrupolar pupil intensity distribution for each point in the still exposure region ER2, in the secondary light source 60 formed on the illumination pupil plane 27. In this example, the measuring device measures each of the first pupil intensity distribution 61 and the second pupil intensity distribution 62 formed on the illumination pupil plane 27 by the incident beams EL1, EL2, EL3 to enter the center point P1b and the peripheral points P2b, P3b in the still exposure region ER2. In this case, the first pupil intensity distribution 61 and the second pupil intensity distribution 62 have mutually different properties. For this reason, through the drive of the unrepresented reciprocal movement device, the transmission filter 64 is arranged in the optical path of the exposure light EL emitted from the first surface illuminant 60a of the secondary light source 60 and in the optical path of the exposure light EL emitted from the second surface illuminant 60b. On this occasion, the transmission filter 64 is located at the position approximately identical in the Y-axis direction to the illumination pupil plane 27 (which will be referred to hereinafter as "initial position") in the first adjustment region 63.

Figure 9:
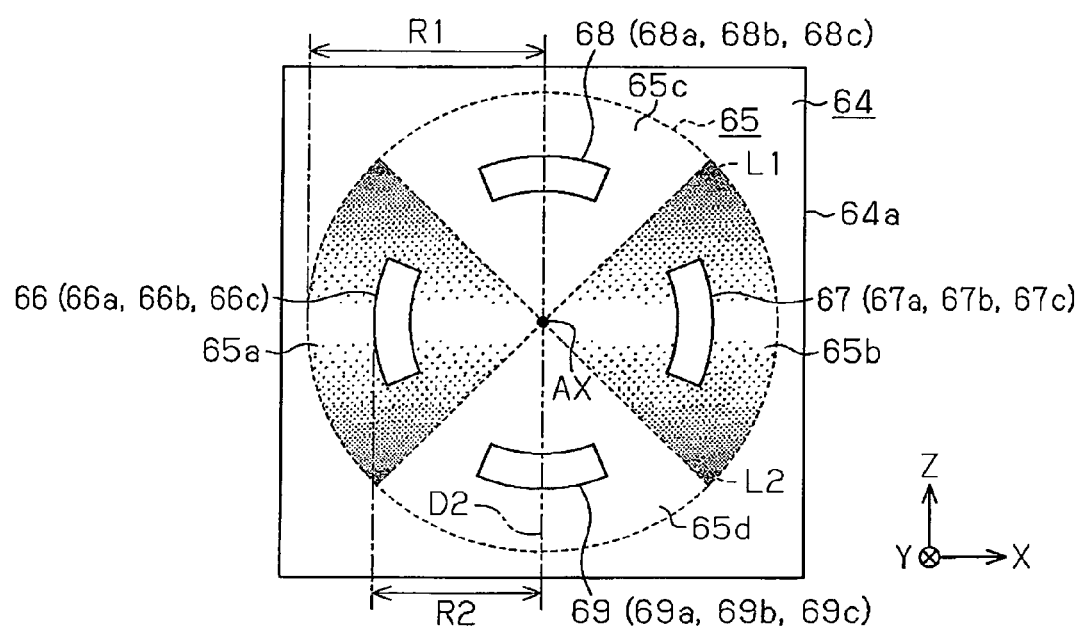
FIG. 9 is an exemplary front view schematically showing a transmission filter in the first embodiment.
Figure 10:
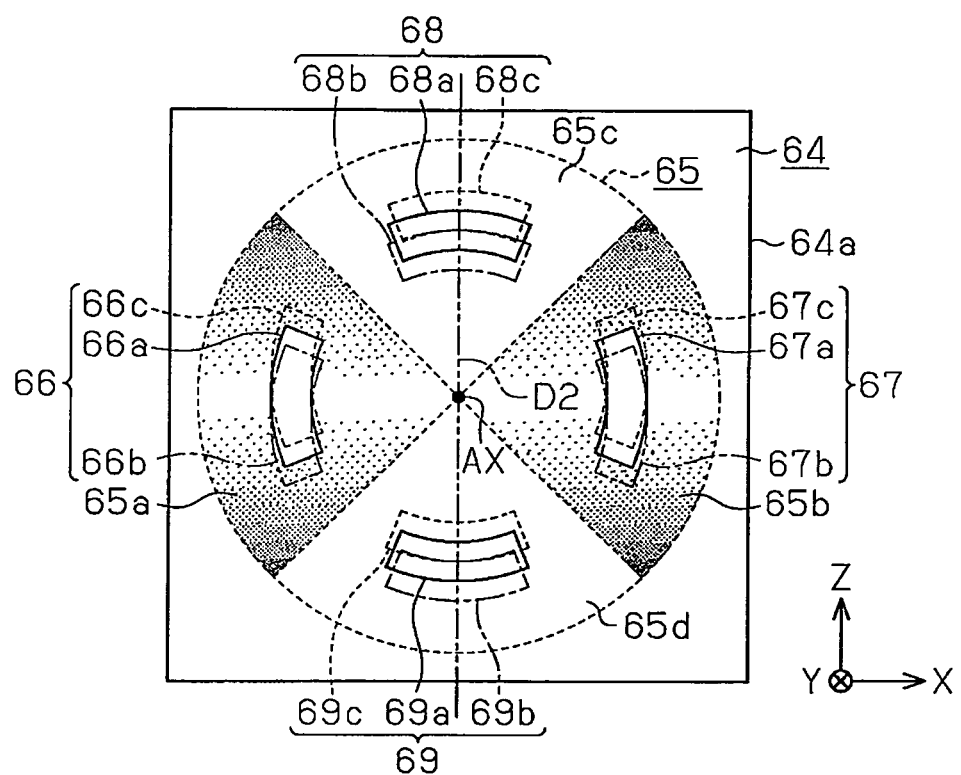
FIG. 10 is an exemplary action diagram in a situation where the transmission filter is moved along the Y-axis direction.
Figure 11:
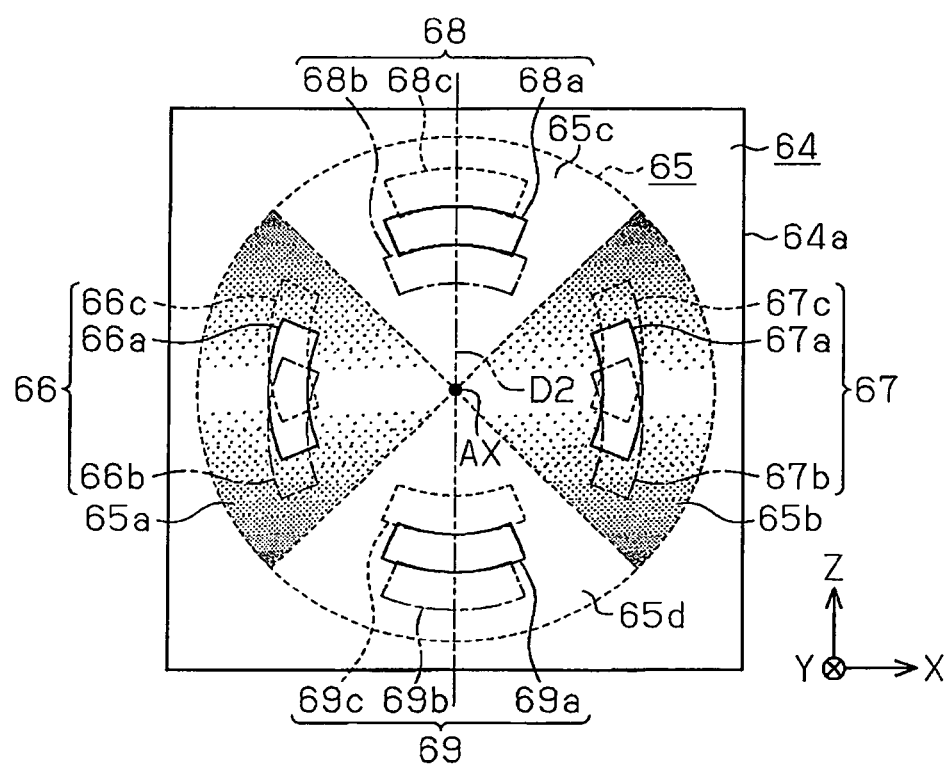
FIG. 11 is an exemplary action diagram in a situation where the transmission filter is moved along the Y-axis direction.
Figure 12:
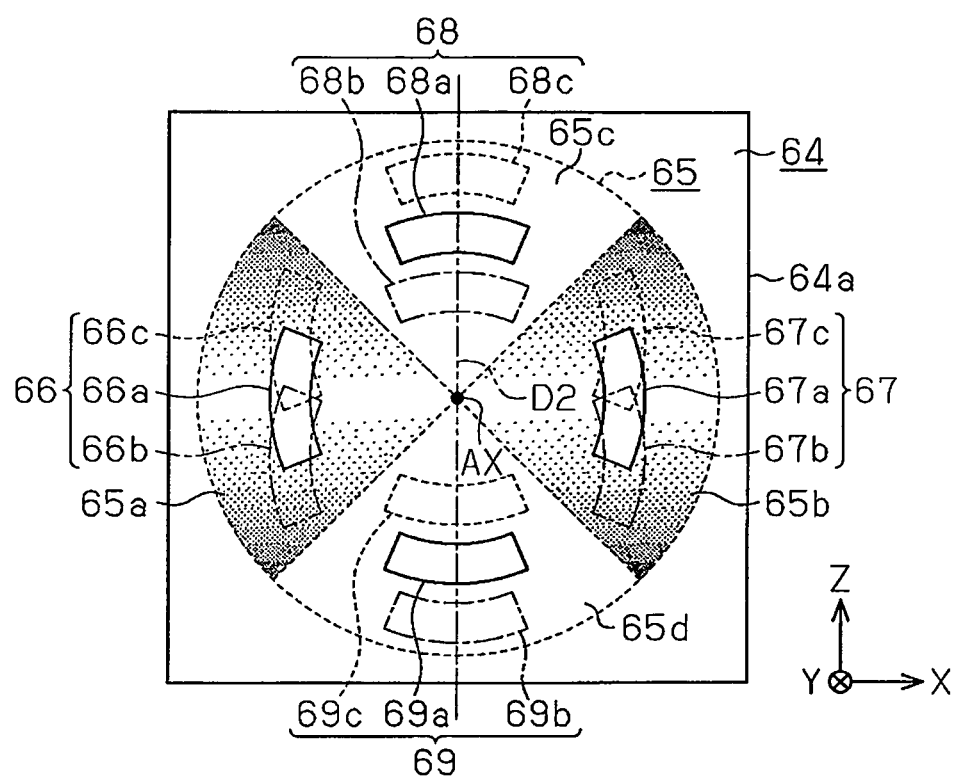
FIG. 12 is an exemplary action diagram in a situation where the transmission filter is moved along the Y-axis direction.
Figure 13:
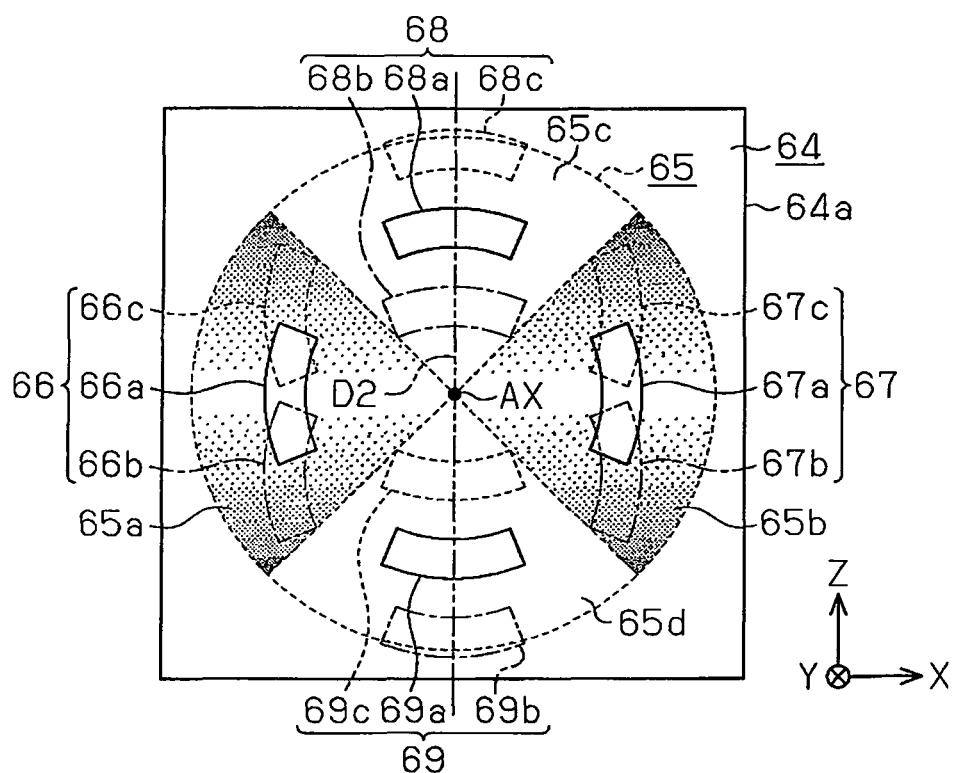
FIG. 13 is an exemplary action diagram in a situation where the transmission filter is moved along the Y-axis direction.

Then the first incidence region 66a and the second incidence region 67a formed on the transmission filter 64 by the first surface illuminant 61a and the second surface illuminant 61b of the first pupil intensity distribution 61 are formed in respective central regions in the Z-axis direction in the first filter region 65a and in the second filter region 65b (cf. FIG. 9). The first incidence regions 66b, 66c and the second incidence regions 67b, 67c formed on the transmission filter 64 by the first surface illuminant 62a and the second surface illuminant 62b of the second pupil intensity distribution 62 are formed in respective central regions in the Z-axis direction in the first filter region 65a and in the second filter region 65b (cf. FIG. 9). Namely, when the transmission filter 64 is located at the initial position, the first incidence regions 66a, 66b, 66c are formed at their respective positions substantially identical to each other in the first filter region 65a and the second incidence regions 67a, 67b, 67c are formed at their respective positions substantially identical to each other in the second filter region 65b. For this reason, the transmission filter 64 causes slight extinction of each of the first incident beams EL1 to enter the center point P1b, the second incident beams EL2 to enter the peripheral point P2b, and the third incident beams EL3 to enter the peripheral point P3b, in the exposure light EL emitted from the first surface illuminant 60a and the second surface illuminant 60b. In addition, degrees of extinction of those beams are approximately equal to each other. Therefore, the first pupil intensity distribution 61 and the second pupil intensity distribution 62 still have respective properties different from each other.

When the transmission filter 64 is moved in the +Y-direction (to the right in FIG. 8) from the initial position by the drive force from the movement mechanism 70, incident modes of the respective incident beams EL1, EL2, EL3 incident into the transmission filter 64 vary as shown in FIGS. 10 to 13. Namely, the first incident beams EL1 emitted from the respective surface illuminants 61a-61d of the first pupil intensity distribution 61 corresponding to the center point P1b, in the exposure light EL emitted from the secondary light source 60, are incident approximately at the same positions as in the case where the transmission filter 64 is located at the initial position, even with change in the position in the Y-axis direction of the transmission filter 64. In other words, the respective forming positions in the transmission filter 64 of the respective incidence regions 66a, 67a, 68a, 69a (the regions enclosed by solid lines in FIGS. 10 to 13) formed by the first incident beams EL1 have little change even with the movement of the transmission filter 64 along the Y-axis direction.

The incidence positions into the transmission filter 64 of the respective second incident beams EL2 emitted from the respective surface illuminants 62a-62d of the second pupil intensity distribution 62 corresponding to the peripheral point P2b gradually move in the −Z-direction (to the lower side in FIGS. 10 to 13) with movement of the transmission filter 64 in a direction away from the illumination pupil plane 27. In other words, the forming positions in the transmission filter 64 of the respective incidence regions 66b, 67b, 68b, 69b (the regions enclosed by chain lines in FIGS. 10 to 13) formed by the respective second incident beams EL2 gradually move in the −Z-direction with the movement of the transmission filter 64 in the direction away from the illumination pupil plane 27. In the present embodiment, when the transmission filter 64 moves to the farthest position from the illumination pupil plane 27 in the movable range, a part of the fourth incidence region 69b formed on the transmission filter 64 by the second incident beam EL2 emitted from the fourth surface illuminant 62d (specifically, a portion on the −Z-directional side) becomes located outside the fourth filter region 65d.

The incidence positions into the transmission filter 64 of the respective third incident beams EL3 emitted from the surface illuminants 62a-62d of the second pupil intensity distribution 62 corresponding to the peripheral point P3b gradually move in the +Z-direction (to the upper side in FIGS. 10 to 13) with movement of the transmission filter 64 in the direction away from the illumination pupil plane 27. In other words, the forming positions in the transmission filter 64 of the respective incidence regions 66c, 67c, 68c, 69c (the regions enclosed by dashed lines in FIGS. 10 to 13) formed by the respective third incident beams EL3 gradually move in the +Z-direction with the movement of the transmission filter 64 in the direction away from the illumination pupil plane 27. In the present embodiment, when the transmission filter 64 moves to the farthest position from the illumination pupil plane 27 in the movable range, a part of the third incidence region 68c formed in the transmission filter 64 by the third incident beam EL3 emitted from the third surface illuminant 62c (specifically, a portion on the +Z-directional side) becomes located outside the third filter region 65c.

When the transmission filter 64 is moved away from the illumination pupil plane 27 along the Y-axis direction as described above, the first incidence regions 66b, 66c corresponding to the peripheral points P2b, P3b are formed at their respective positions different in the Z-axis direction from the position of the first incidence region 66a corresponding to the center point P1b. The second incidence regions 67b, 67c are formed at their respective positions different in the Z-axis direction from the position of the second incidence region 67a. Namely, the first incidence regions 66b, 66c and the second incidence regions 67b, 67c are formed at the respective positions where the extinction action is stronger than in the first incidence region 66a and the second incidence region 67a in the filter regions 65a, 65b. For this reason, the first incident beams EL1 emitted from the first surface illuminant 61a and the second surface illuminant 61b of the first pupil intensity distribution 61 are subjected to slight extinction by the transmission filter 64 and the second incident beams EL2 and the third incident beams EL3 emitted from the first surface illuminant 62a and the second surface illuminant 62b of the second pupil intensity distribution 62 are subjected to great extinction by the transmission filter 64. In addition, each of the first filter region 65a and the second filter region 65b is formed so that the extinction mode on the +Z-directional side with respect to the center in the Z-axis direction is approximately equal to the extinction mode on the −Z-directional side with respect to the center in the Z-axis direction. Therefore, the second incident beams EL2 and the third incident beams EL3 emitted from the first surface illuminant 62a and the second surface illuminant 62b undergo extinction at the same level as passing through the transmission filter 64.

As a result, the property of the first pupil intensity distribution 61 becomes approximately identical to the property of the second pupil intensity distribution 62. Namely, the light intensity of the first incident beams EL1 to enter the center point P1b of the still exposure region ER2 from the respective surface illuminants 61a-61d become approximately equal to the light intensity of the second incident beams EL2 and the third incident beams EL3 to enter the peripheral points P2b, P3b of the still exposure region ER2 from the respective surface illuminants 62a-62d. Therefore, when an exposure process is executed in this state, occurrence of variation in the line width of the pattern formed on the surface Wa of the wafer W is suppressed because the pupil intensity distributions 61, 62 corresponding to the respective points P1b, P2b, P3b along the Y-axis direction in the still exposure region ER2 on the wafer W have much the same properties.

Therefore, the present embodiment can achieve the effects described below.

(1) The transmission filter 64 arranged in the first adjustment region 63 is formed with the transmittance characteristic varying according to positions of incidence of the exposure light EL. By moving this transmission filter 64 along the optical axis AX of the illumination optical system 13 in the first adjustment region 63, the pupil intensity distributions 61, 62 at the respective points P1b-P3b in the still exposure region ER2 on the wafer W are independently adjusted. This permits the pupil intensity distributions 61, 62 at the respective points P1b-P3b in the still exposure region ER2 to be adjusted to distributions with properties substantially identical to each other.

(2) In the present embodiment, the correction filter 24 for equally adjusting the pupil intensity distributions 61, 62 corresponding to the respective points P1b-P3b in the still exposure region ER2 on the wafer W is provided at the position optically conjugate with the surface Wa of the wafer W on the light source device 12 side with respect to the optical integrator 26. Then the pupil intensity distributions 61, 62 corresponding to the respective points P1b-P3b in the still exposure region ER2 are adjusted so as to be substantially uniform, by the cooperative action of the correction filter 24 and the transmission filter 64. For this reason, the pupil intensity distributions 61, 62 corresponding to the respective points P1b-P3b in the still exposure region ER2 can be adjusted in higher precision than in the case where the correction filter 24 is not located in the optical path of the exposure light EL. Therefore, the exposure process for the wafer W can be carried out under an appropriate illumination condition according to the circuit pattern of the reticle R and, as a result, the pattern can be faithfully formed in a desired line width across the entire area of the wafer W.

(3) In the present embodiment, the transmission filter 64 moves along the Y-axis direction, based on the measurement results calculated based on the detection signals from the pupil intensity distribution measuring device 36, i.e., based on the pupil intensity distributions 61, 62 corresponding to the respective points P1a-P3a in the illumination region ER1 of the reticle R. For this reason, if the pupil intensity distributions 61, 62 vary because of deterioration of at least one optical element out of the various optical elements constituting the illumination optical system 13, the transmission filter 64 is moved based on the measurement results by the pupil intensity distribution measuring device 36, whereby the pupil intensity distributions 61, 62 can be quickly adjusted so that the distributions with the properties are modified to distributions with desired properties.

(4) The transmission filter 64 is arranged near the illumination pupil plane 27. For this reason, as the transmission filter 64 is moved along the Y-axis direction, each of positional relations changes among the incidence regions 66a-69a formed on the transmission filter 64 by the first incident beams EL1 emitted from the respective surface illuminants 61a-61d of the first pupil intensity distribution 61 and the incidence regions 66b-69b, 66c-69c formed on the transmission filter 64 by the second incident beams EL2 and the incident beams EL3 emitted from the respective surface illuminants 62a-62d of the second pupil intensity distribution 62. Namely, the properties of the respective pupil intensity distributions 61, 62 can be adjusted by changing the positional relations among the incidence regions 66a-69a, the incidence regions 66b-69b, and the incidence regions 66c-69c.

(5) In the present embodiment, as the transmission filter 64 is moved along the Y-axis direction, the forming positions of the incidence regions 66b-69b, 66c-69c formed by the second incident beams EL2 and the third incident beams EL3 on the transmission filter 64 are displaced each along the Z-axis direction. The first filter region 65a and the second filter region 65b each are formed so as to have different transmittances depending upon positions in the Z-axis direction, corresponding to the displacement along the Z-axis direction of the incidence regions 66b-69b, 66c-69c. For this reason, the properties of the respective pupil intensity distributions 61, 62 can be suitably adjusted by moving the transmission filter 64 of the present embodiment along the Y-axis direction in the first adjustment region 63.

(6) In the present embodiment, the filter regions 65a-65d corresponding to the respective surface illuminants 60a-60d are formed in the single transmission filter 64. For this reason, the configuration of the distribution correction optical system 31 is prevented from becoming complicated, when compared to a configuration wherein transmission filters are individually provided for the respective surface illuminants 60a-60d.

(7) The transmittance distribution of the first filter region 65a is the same distribution as the transmittance distribution of the second filter region 65b. For this reason, it is feasible to approximately equalize the degrees of extinction of the second incident beams EL2 and the third incident beams EL3 emitted from the first surface illuminant 62a and the second surface illuminant 62b of the second pupil intensity distribution 62.

Second Embodiment

The second embodiment will be described below according to FIGS. 14A and 14B. The second embodiment is different in the configuration of the distribution correction optical system from the first embodiment. Therefore, the following will mainly describe the differences from the first embodiment and identical or equivalent members to those in the first embodiment will be denoted by the same reference signs, without redundant description.

Figure 14A:
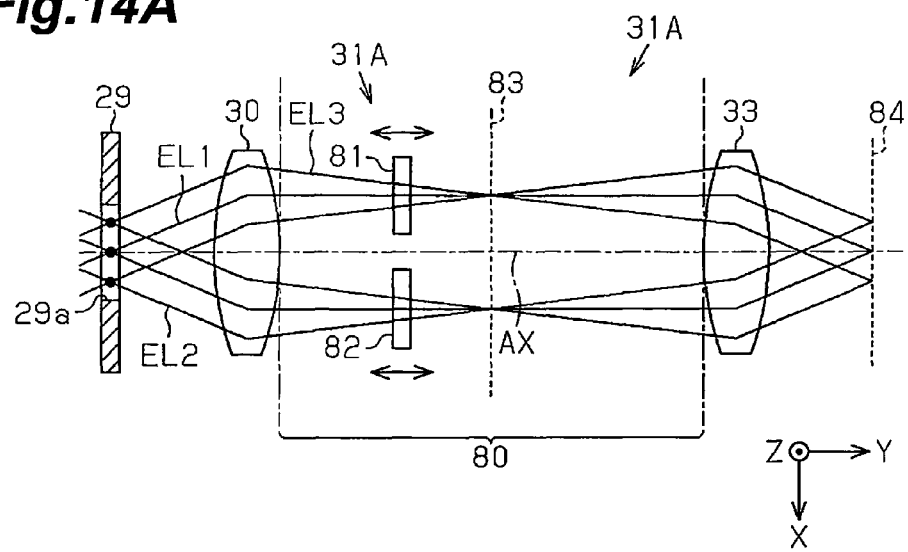
FIG. 14A is an exemplary schematic configuration diagram showing the distribution correction optical system in the second embodiment and FIG. 14B is an exemplary front view schematically showing each of transmission filters.

As shown in FIG. 14A, the distribution correction optical system 31A in the present embodiment is provided with a plurality of (two in the present embodiment) transmission filters 81, 82 arranged in a second adjustment region 80 between the second condenser optical system 30 and the entrance-side lens unit 33. These transmission filters 81, 82 are arranged to individually move along the Y-axis direction in the second adjustment region 80 by the drive force from the movement mechanism 70. In the second adjustment region 80 there is a pupil conjugate plane 83 optically conjugate with the illumination pupil plane 27 located on the exit side of the optical integrator 26, and an image-plane conjugate plane 84 optically conjugate with the reticle blind 29 is located on the exit side of the entrance-side lens unit 33.

Figure 14B:
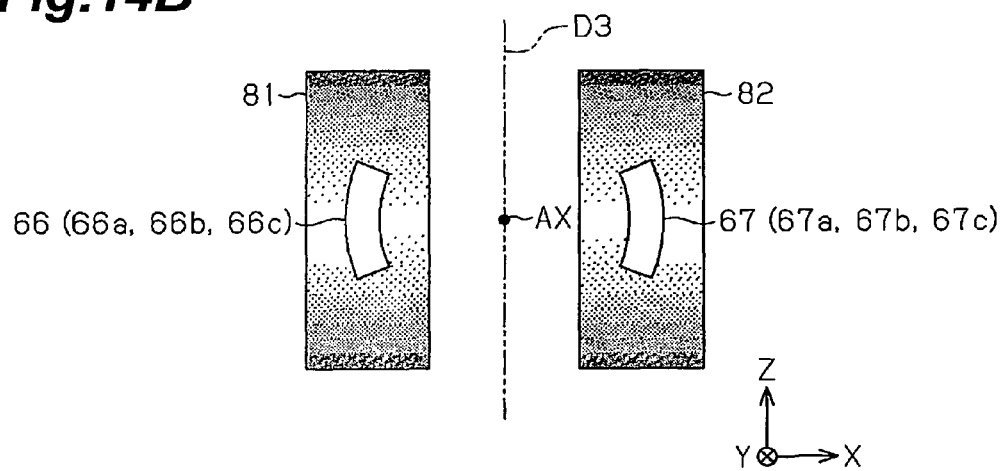

As shown in FIGS. 14A and 14B, the first transmission filter 81 out of the transmission filters 81, 82 is arranged in the optical path of the exposure light EL emitted from the first surface illuminant 60a corresponding to the first region of the secondary light source 60 formed on the illumination pupil plane 27. The other second transmission filter 82 is arranged in the optical path of the exposure light EL emitted from the second surface illuminant 60b corresponding to the second region different from the first region in the secondary light source 60. Namely, the transmission filters 81, 82 are arranged on both sides of an imaginary division plane D3 (which is the Y-Z plane in FIG. 14B and is indicated by a chain double-dashed line) including the optical axis AX of the illumination optical system 13.

A first transmittance distribution formed on the first transmission filter 81 is the same as a second transmittance distribution formed on the second transmission filter 82. Specifically, the transmittance distribution of each transmission filter 81, 82 is formed so that the transmittance is the highest in a central region in the Z-axis direction corresponding to the longitudinal direction of the still exposure region ER2 and the transmittance gradually decreases with distance from the central region in the Z-axis direction. Such transmittance distribution is formed of a pattern of light-blocking dots comprised of chromium or chromium oxide.

Each of the incident beams EL1-EL3 emitted from the large number of unillustrated point light sources (predetermined points) constituting the first surface illuminant 60a passes through the first transmission filter 81 located on the −X-directional side with respect to the division plane D3. Each of the incident beams EL1-EL3 emitted from the large number of unillustrated point light sources (predetermined points) constituting the second surface illuminant 60b passes through the second transmission filter 82 located on the +X-directional side with respect to the division plane D3. On the other hand, the incident beams EL1-EL3 emitted from the large number of unillustrated point light sources (predetermined points) constituting the third surface illuminant 60c and the fourth surface illuminant 60d are incident into the entrance-side lens unit 33 without passing through the transmission filters 81, 82. As a result, the first incidence region 66 is formed by the exposure light EL emitted from the first surface illuminant 60a, in the first transmission filter 81 and the second incidence region 67 is formed by the exposure light EL emitted from the second surface illuminant 60b, in the second transmission filter 82.

FIG. 14B is an exemplary schematic front view of the transmission filters 81, 82 viewed from the second condenser optical system 30 side in a state in which the transmission filters 81, 82 are located at the same position in the Y-axis direction as the pupil conjugate plane 83. For this reason, the incidence regions 66a, 67a formed by the first incident beams EL1, the incidence regions 66b, 67b formed by the second incident beams EL2, and the incidence regions 66c, 67c formed by the third incident beams EL3 are formed approximately at the same position in the respective transmission filters 81, 82.

When the transmission filters 81, 82 are arranged at the same position as the pupil conjugate plane 83 in the Y-axis direction, the incidence regions 66a-66c, 67a-67c are formed each at the center in the Z-axis direction of the transmission filters 81, 82, respectively. For this reason, the incident beams EL1-EL3 emitted from the first surface illuminant 60a and the second surface illuminant 60b are subjected to little extinction by the transmission filters 81, 82. As the transmission filters 81, 82 are moved in the direction away from the pupil conjugate plane 83 in the Y-axis direction, the forming positions of the incidence regions 66a, 67a formed in the transmission filters 81, 82 by the first incident beams EL1 emitted from the first surface illuminant 60a and the second surface illuminant 60*b* show little displacement in the Z-axis direction. On the other hand, the forming positions of the incidence regions 66*b*, 67*b* formed in the transmission filters 81, 82 by the second incident beams EL2 emitted from the first surface illuminant 60*a* and the second surface illuminant 60*b* each are gradually displaced in the −Z-direction as the transmission filters 81, 82 are moved along the Y-axis direction away from the pupil conjugate plane 83. The forming positions of the incidence regions 66*c*, 67*c* formed in the transmission filters 81, 82 by the third incident beams EL3 emitted from the first surface illuminant 60*a* and the second surface illuminant 60*b* each are gradually displaced in the +Z-direction as the transmission filters 81, 82 are moved along the Y-axis direction away from the pupil conjugate plane 83.

When the positions in the Y-axis direction of the transmission filters 81, 82 as described above are adjusted based on the measurement results by the pupil intensity distribution measuring device 36, the properties of the respective pupil intensity distributions 61, 62 for the respective points P1b-P3b in the still exposure region ER2 on the wafer W each are adjusted.

In the present embodiment, the transmission filters 81, 82 can be individually moved along the Y-axis direction. In this case, among the second incident beams EL2 to enter the peripheral point P2b of the still exposure region ER2, the transmittance of the second incident beam EL2 passing through the first transmission filter 81 is different from the transmittance of the second incident beam EL2 passing through the second transmission filter 82. For this reason, if it is desired to make the light intensity of the second incident beam EL2 passing through the first transmission filter 81, different from the light intensity of the second incident beam EL2 passing through the second transmission filter 82, the distance in the Y-axis direction between the first transmission filter 81 and the pupil conjugate plane 83 can be made different from the distance in the Y-axis direction between the second transmission filter 82 and the pupil conjugate plane 83. The same also applies to the third incident beams EL3 to enter the peripheral point P3b of the still exposure region ER2.

Therefore, the present embodiment can achieve the effects described below.

(8) The transmission filters 81, 82 arranged in the second adjustment region 80 each are formed so that their transmittance characteristic varies according to positions of incidence of the exposure light EL. The pupil intensity distributions 61, 62 at the respective points P1b-P3b in the still exposure region ER2 on the wafer W are independently adjusted by moving such transmission filters 81, 82 along the optical axis AX of the illumination optical system 13 in the second adjustment region 80. For this reason, the pupil intensity distributions 61, 62 at the respective points P1b-P3b in the still exposure region ER2 can be adjusted to distributions with properties substantially identical to each other.

(9) In the present embodiment, the correction filter 24 for equally adjusting the pupil intensity distributions 61, 62 corresponding to the respective points P1b-P3b in the still exposure region ER2 on the wafer W is provided at the position optically conjugate with the surface Wa of the wafer W, on the light source device 12 side with respect to the optical integrator 26. Then the pupil intensity distributions 61, 62 corresponding to the respective points P1b-P3b in the still exposure region ER2 are adjusted so as to be almost uniform, by the cooperative action of the correction filter 24 and the transmission filters 81, 82. For this reason, the pupil intensity distributions 61, 62 corresponding to the respective points P1b-P3b in the still exposure region ER2 can be adjusted in higher precision than in the case where the correction filter 24 is not located in the optical path of the exposure light EL. Therefore, the exposure process for the wafer W can be carried out under an appropriate illumination condition according to the circuit pattern of the reticle R and, as a result, the pattern can be faithfully formed in a desired line width across the entire area of the wafer W.

(10) In the present embodiment, the transmission filters 81, 82 each are moved along the Y-axis direction, based on the measurement results calculated based on the detection signals from the pupil intensity distribution measuring device 36, i.e., based on the pupil intensity distributions 61, 62 corresponding to the respective points P1a-P3a in the illumination region ER1 on the reticle R. For this reason, if the pupil intensity distributions 61, 62 show a change due to deterioration or the like of at least one optical element out of the various optical elements constituting the illumination optical system 13, the pupil intensity distributions 61, 62 can be quickly adjusted to change the distributions with the properties to distributions with desired properties, by moving the transmission filters 81, 82 on the basis of the measurement results by the pupil intensity distribution measuring device 36.

(11) The transmission filters 81, 82 are arranged each near the pupil conjugate plane 83. For this reason, movement of each of the transmission filters 81, 82 along the Y-axis direction results in changing each of positional relations among the incidence regions 66*a*, 67*a* formed in the transmission filters 81, 82 by the first incident beams EL1 emitted from the first surface illuminant 61*a* and the second surface illuminant 61*b* of the first pupil intensity distribution 61, and the incidence regions 66*b*, 67*b*, 66*c*, 67*c* formed in the transmission filters 81, 82 by the second incident beams EL2 and the incident beams EL3 emitted from the first surface illuminant 62*a* and the second surface illuminant 62*b* of the second pupil intensity distribution 62. Namely, the properties of the pupil intensity distributions 61, 62 can be adjusted by changing the positional relations among the incidence regions 66*a*, 67*a*, the incidence regions 66*b*, 67*b*, and the incidence regions 66*c*, 67*c*.

(12) In the present embodiment, as the transmission filters 81, 82 are moved along the Y-axis direction, the forming positions of the incidence regions 66*b*, 67*b*, 66*c*, 67*c* formed by the second incident beams EL2 and the third incident beams EL3 in the transmission filters 81, 82 are displaced each along the Z-axis direction. Each of the transmission filters 81, 82 is formed so as to have the transmittances varying depending upon positions in the Z-axis direction, corresponding to the displacement along the Z-axis direction of the incidence regions 66*b*, 67*c*, 66*c*, 67*c*. For this reason, the properties of the pupil intensity distributions 61, 62 can be suitably adjusted by moving the transmission filters 81, 82 of the present embodiment along the Y-axis direction in the second adjustment region 80.

(13) The first transmittance distribution of the first transmission filter 81 and the second transmittance distribution of the second transmission filter 82 are identical to each other. For this reason, when the distance in the Y-axis direction between the first transmission filter 81 and the pupil conjugate plane 83 is set to be approximately equal to the distance in the Y-axis direction between the second transmission filter 82 and the pupil conjugate plane 83, the degrees of extinction of the second incident beams EL2 and the third incident beams EL3 emitted from the first surface illuminant 62*a* and the second surface illuminant 62*b* of the second pupil intensity distribution 62 can be made approximately equal to each other.

(14) In the present embodiment, the transmission filters 81, 82 can be individually moved along the Y-axis direction. For this reason, it is feasible to individually adjust the light intensity of the second incident beams EL2 and the third incident beams EL3 passing through the first transmission filter 81 and the light intensity of the second incident beams EL2 and the third incident beams EL3 passing through the second transmission filter 82. Therefore, the properties and others of the pupil intensity distributions 61, 62 for the respective points P1b-P3b can be adjusted more finely than in the case of the first embodiment.

Third Embodiment

The third embodiment will be described below according to FIG. 15. The third embodiment is different in the configuration of the distribution correction optical system from each of the first and second embodiments. Therefore, the following will mainly describe the differences from the first and second embodiments and identical or equivalent members to those in the first and second embodiments will be denoted by the same reference signs, without redundant description.

Figure 15:
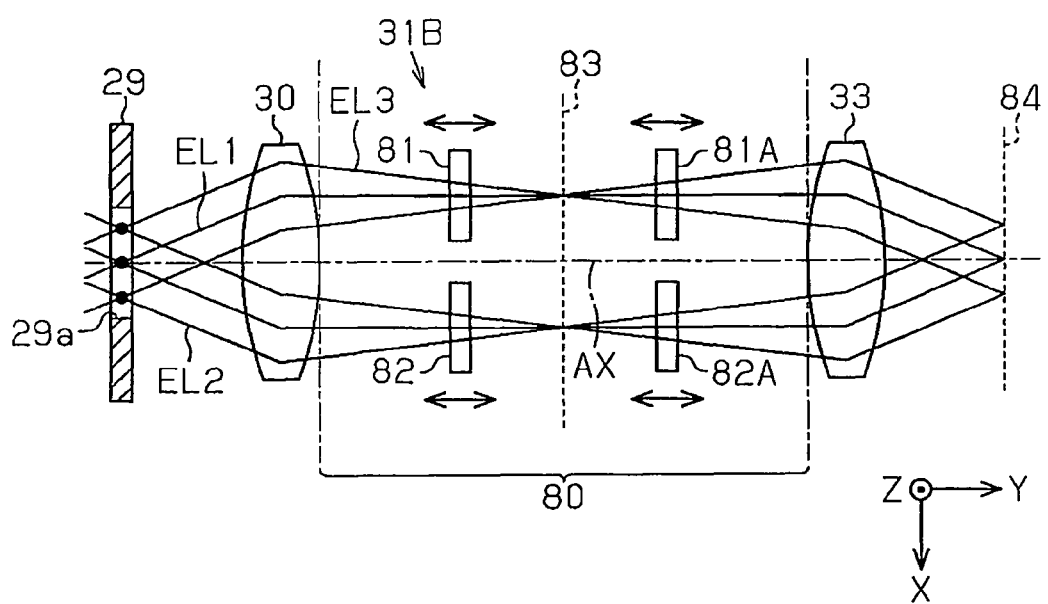
FIG. 15 is an exemplary schematic configuration diagram showing the distribution correction optical system in the third embodiment.

As shown in FIG. 15, the distribution correction optical system 31B in the present embodiment is provided with a plurality of (two in the present embodiment) first transmission filters 81, 81A arranged along the Y-axis direction in the optical path of the exposure light EL emitted from the first surface illuminant 60a of the secondary light source 60 formed on the illumination pupil plane 27. The distribution correction optical system 31B is further provided with a plurality of (two in the present embodiment) second transmission filters 82, 82A arranged along the Y-axis direction in the optical path of the exposure light EL emitted from the second surface illuminant 60b of the secondary light source 60. The transmission filters 81, 82, 81A, 82A are arranged each in the second adjustment region 80.

Each of transmittance distributions of the respective transmission filters 81, 82 located on the second condenser optical system 30 side out of the transmission filters 81, 82, 81A, 82A is set, as described above, so that the transmittance is the highest at the center in the Z-axis direction and the transmittance gradually decreases with distance from the center in the Z-axis direction. Each of transmittance distributions of the respective transmission filters 81A, 82A located on the entrance-side lens unit 33 side, different from the transmission filters 81, 82, is set so that the transmittance is the lowest at the center in the Z-axis direction and the transmittance gradually increases with distance from the center in the Z-axis direction.

The distribution correction optical system 31B is provided with the movement mechanism 70 for individually moving the transmission filters 81, 82, 81A, 82A. This movement mechanism 70 is configured so as to be able to individually provide a first drive force for moving each transmission filter 81, 82, 81A, 82A along the Y-axis direction and a second drive force for moving each transmission filter 81, 82, 81A, 82A along the Z-axis direction, to the transmission filters 81, 82, 81A, 82A.

In the present embodiment, when compared to each of the above embodiments, the number of filters arranged in the respective optical paths of the exposure light EL emitted from the first surface illuminant 60a and the second surface illuminant 60b increases and each transmission filter 81, 82, 81A, 82A can be moved not only in the Y-axis direction but also in the Z-axis direction. For this reason, it is feasible to individually adjust the light intensity of each of the incident beams EL1-EL3 passing through the first transmission filters 81, 81A and the light intensity of each of the incident beams EL1-EL3 passing through the second transmission filters 82, 82A, among the incident beams EL1-EL3 to enter the respective points P1b-P3b in the still exposure region ER2 on the wafer W.

The above-described embodiments may be modified into other embodiments as described below.

In each of the embodiments, the diffraction optical element 19 may be a diffraction optical element for any multi-polar illumination (e.g., for dipolar illumination) other than the quadrupolar illumination, or a diffraction optical element for annular illumination, or a diffraction optical element for circular shape. Furthermore, any other optical element such as an axicon lens pair may be arranged instead of the diffraction optical element 19 or in addition to the diffraction optical element 19 as long as it is an optical element capable of modifying the shape of the exposure light EL. The illumination optical system with the axicon lens pair is disclosed, for example, in U.S. Patent Application Laid-Open No. 2006/0170901. In the embodiment shown in FIG. 1, the axicon lens pair can be arranged near the correction filter 24.

The diffraction optical element 19 may be replaced by a spatial light modulator, for example, composed of a large number of microscopic element mirrors arranged in an array form and individually driven and controlled in their angle and direction of inclination, which is arranged to divide an incident beam into microscopic units corresponding to respective reflective faces and to deflect the microscopic beam units, thereby converting a cross section of the beam into a desired shape or desired size. The illumination optical system using such a spatial light modulator is disclosed, for example, in Japanese Patent Application Laid-Open No. 2002-353105.

In each of the first and second embodiments, the transmission filter 64, 81, 82 may be arranged to move not only in the Y-axis direction but also in the Z-axis direction or in the X-axis direction.

Similarly, in the third embodiment, each of the transmission filters 81, 82, 81A, 82A may be arranged to move in the X-axis direction as well. Each of the transmission filters 81, 82 may be arranged to move only in the Y-axis direction and each of the transmission filters 81A, 82A may be arranged to move in a direction intersecting with the Y-axis direction (e.g., in the X-axis direction or in the Z-axis direction). On this occasion, the transmittance distribution of each transmission filter 81A, 82A may be adjusted so that the transmittance is the highest in the central region in the Z-axis direction and the transmittance gradually decreases with distance from the central region in the Z-axis direction.

In each of the embodiments, the transmission filter 64, 81, 82, 81A, 82A may have any transmittance distribution as long as the transmittance distribution of the transmission filter 64, 81, 82, 81A, 82A is an appropriate distribution according to the properties of the respective pupil intensity distributions 61, 62 corresponding to the points P1a-P3b. For example, when it is desired to implement greater extinction of the first incident beams EL1 emitted from the first surface illuminant 60a and the second surface illuminant 60b than that of the second incident beams EL2 and the third incident beams EL3 emitted from the first surface illuminant 60a and the second surface illuminant 60b, we may use the transmission filter 64, 81, 82, 81A, 82A set so that the transmittance is the lowest in the central region in the Z-axis direction and the transmittance gradually increases with distance from the central region in the Z-axis direction.

In the case of such optical design that as the transmission filter 64 is moved along the Y-axis direction away from the illumination pupil plane 27, the forming positions of the incidence regions 66b-69b, 66c-69c formed in the transmission filter 64 by the second incident beams EL2 and the third incident beams EL3 are displaced each in the X-axis direction, the transmission filter 64 may be a filter designed as described below. Namely, the transmission filter 64 may be a filter set so that the transmittance is the highest in the central region in the X-axis direction in the first filter region 65a and the second filter region 65b thereof and the transmittance gradually decreases with distance from the central region in the X-axis direction.

Similarly, in the case of such optical design that as the transmission filters 81, 82 are moved along the Y-axis direction away from the pupil conjugate plane 83, the forming positions of the respective incidence regions 66b-69b, 66c-69c formed in the transmission filters 81, 82 by the second incident beams EL2 and the third incident beams EL3 are displaced each in the X-axis direction, the transmission filters 81, 82 may be filters designed as described below. Namely, the transmission filters 81, 82 may be filters set so that the transmittance is the highest in the central region in the X-axis direction and the transmittance gradually decreases with distance from the central region in the X-axis direction.

In the first embodiment, a transmittance distribution for extinction of the exposure light EL incident into each of the filter regions 65c, 65d may be formed in each of the third filter region 65c and the fourth filter region 65d in the transmission filter 64. The transmittance distribution of each filter region 65c, 65d may be a distribution of transmittances varying according to positions of incidence of the exposure light EL. This configuration makes it feasible to individually adjust the degrees of extinction of the first incident beams EL1, the second incident beams EL2, and the third incident beams EL3 emitted from the third surface illuminant 60c and the fourth surface illuminant 60d of the secondary light source 60.

In each of the second and third embodiments, a transmission filter with a transmittance distribution of transmittances varying according to positions of incidence of light may be arranged in the optical paths of the exposure light EL emitted from the third surface illuminant 60c and the fourth surface illuminant 60d of the secondary light source 60.

In the first embodiment, an optical element without power (e.g., a plane-parallel plate) may be arranged between the optical integrator 26 and the first condenser optical system 28. In this case, the first adjustment region 63 where the transmission filter 64 is arranged is a region between the optical integrator 26 and the optical element without power.

In each of the second and third embodiments, an optical element without power (e.g., a plane-parallel plate) may be arranged between the pupil conjugate plane 83 and the second condenser optical system 30. In this case, the second adjustment region 80 where the transmission filters 81, 82, 81A, 82A are arranged is a region between the optical element without power and the entrance-side lens unit 33.

Furthermore, an optical element without power may be arranged between the pupil conjugate plane 83 and the entrance-side lens unit 33. In this case, the second adjustment region 80 where the transmission filters 81, 82, 81A, 82A are arranged is a region between the second condenser optical system 30 and the optical element without power.

Of course, optical elements without power may be arranged on both sides in the Y-axis direction of the pupil conjugate plane 83. In this case, a region between the optical elements without power is the second adjustment region 80 where the transmission filters 81, 82, 81A, 82A are arranged.

In each of the embodiments, the movement mechanism 70 does not always have to be configured to drive in synchronism with the measurement results by the pupil intensity distribution measuring device 36. Namely, it is possible to adopt a configuration wherein the measurement results by the pupil intensity distribution measuring device 36 are displayed on a display screen such as an unillustrated monitor and an operator moves the transmission filter 64, 81, 82, 81A, 82A along the Y-axis direction on the basis of the measurement results displayed on the display screen. In this case, the movement mechanism 70 does not have to be provided with the drive source 72. Namely, the transmission filter 64, 81, 82, 81A, 82A is manually moved by the operator.

In the first embodiment, the transmission filter 64 may be arranged in the second adjustment region 80. This configuration can also achieve the same effects as the first embodiment.

In the second embodiment, the transmission filters 81, 82 may be arranged in the first adjustment region 63. This configuration can also achieve the same effects as the second embodiment.

Furthermore, in the third embodiment, the transmission filters 81, 82, 81A, 82A may be arranged in the first adjustment region 63. Furthermore, it is also possible to adopt a configuration wherein the transmission filters 81, 82 each are arranged in the second adjustment region 80 and the transmission filters 81A, 82A each are arranged in the first adjustment region 63. This configuration can also achieve the same effects as the third embodiment.

In each of the embodiments, the correction filter 24 may be a filter with any transmittance distribution as long as it is a filter with a transmittance distribution of different transmittances according to positions of incidence of the exposure light EL. It is also possible to adopt a configuration wherein a plurality of correction filters 24 with different transmittance distributions for incidence positions are prepared in such a manner that the correction filter to be arranged in the optical path of exposure light EL can be replaced with another on an as-needed basis. This configuration can increase degrees of freedom for adjustment of the pupil intensity distributions 61, 62 corresponding to the respective points P1b, P2b, P3b in the still exposure region ER2 by the cooperative action of the correction filter 24 and the transmission filter 64, 81, 82, 81A, 82A.

In each of the embodiments, the pupil intensity distribution measuring device 36 does not always have to be located near the reticle R as long as it can measure the pupil intensity distributions 61, 62 corresponding to the respective points P1a, P2a, P3a in the illumination region ER1 on the reticle R. It should be noted, however, that the pupil intensity distribution measuring device 36 may be located at any position as long as the position is near a position optically conjugate with the illumination target surface Ra of the reticle R (or the surface Wa of the wafer W).

In each of the embodiments, the optical integrator 26 may be one composed of a single micro fly's eye lens in which unit wavefront division faces with a refractive index are arrayed along the Z-direction and X-direction. The optical integrator may be a fly's eye lens in which a plurality of lens elements are arrayed. The optical integrator may be a pair of fly's eye mirrors in which a plurality of mirror faces are arrayed. The optical integrator may be a rod type integrator (internal reflection type integrator) extending along the Y-axis direction. When the rod type integrator is used as the optical integrator, a condensing lens system is arranged behind the zoom optical system 25 so that its front focal position coincides with the rear focal position of the zoom optical system 25, and the rod type integrator is arranged so that its entrance end is positioned at or near the rear focal position of the condensing lens system. In this case, an exit end of the rod type integrator is located at the position of the reticle blind 29. In the case of the rod type integrator being used, a position optically conjugate with the position of the aperture stop 42 of the projection optical system 15 in the reticle blind imaging optical system (second condenser optical system 30 and imaging optical system 32) downstream of this rod type integrator can be called an illumination pupil plane. Since a virtual image of the secondary light source on the illumination pupil plane is formed at the position of the entrance surface of the rod type integrator, this position and a position optically conjugate with this position can also be called illumination pupil planes. In this case, the distribution correction optical system 31 can be arranged in a space including this illumination pupil plane (the space between the second condenser optical system 30 and the imaging optical system 32). This space can be regarded as the first adjustment region or the second adjustment region.

In each of the embodiments, it is also possible to apply a technique of filling the optical path between the projection optical system and the photosensitive substrate with a medium having the refractive index of more than 1.1 (typically, a liquid), the so-called liquid immersion method. In this case, the technique of filling the optical path between the projection optical system and the photosensitive substrate with the liquid can be selected from the technique of locally filling the space with the liquid as disclosed in International Publication WO99/49504, the technique of moving a stage holding the substrate as an exposed object, in a liquid bath as disclosed in Japanese Patent Application Laid-Open No. 6-124873, the technique of forming a liquid bath in a predetermined depth on a stage and holding the substrate therein as disclosed in Japanese Patent Application Laid-Open No. 10-303114, and so on. The teachings of International Publication WO99/49504, Japanese Patent Application Laid-Open No. 6-124873, and Japanese Patent Application Laid-Open No. 10-303114 are incorporated herein by reference.

In each of the embodiments, it is also possible to apply the so-called polarized illumination method as disclosed in U.S. Patent Application Laid-Open Nos. 2006/0170901 and 2007/0146676. The teachings of U.S. Patent Application Laid-Open Nos. 2006/0170901 and 2007/0146676 are incorporated herein by reference.

In each of the embodiments, the exposure apparatus 11 may be embodied as a maskless exposure apparatus using a variable pattern generator (e.g., DMD (Digital Mirror Device or Digital Micro-mirror Device)). Such maskless exposure apparatus is disclosed, for example, in Japanese Patent Application Laid-Open No. 2004-304135 and U.S. Patent Application Laid-Open No. 2007/0296936.

In each of the embodiments, the exposure apparatus 11 does not always have to be limited to the exposure apparatus for manufacturing the microdevices such as semiconductor devices, but may be an exposure apparatus which transfers a circuit pattern from a mother reticle onto a glass substrate, a silicon wafer, or the like, in order to manufacture reticles or masks used in an optical aligner, EUV exposure apparatus, X-ray exposure apparatus, electron beam exposure apparatus, and so on. Furthermore, the exposure apparatus 11 may also be an exposure apparatus used in manufacture of displays including liquid crystal display devices (LCD) and others and configured to transfer a device pattern onto a glass plate, an exposure apparatus used in manufacture of thin film magnetic heads and others and configured to transfer a device pattern onto a ceramic wafer or the like, an exposure apparatus used in manufacture of imaging devices such as CCD, and so on.

In each of the embodiments, the exposure apparatus 11 may be embodied as a scanning stepper which transfers a pattern of a reticle R onto a wafer W in a state of relative movement of the reticle R and wafer W and which implements sequential step movement of the wafer W.

In each of the embodiments, the light source device 12 may be a light source capable of supplying, for example, the g-line (436 nm), i-line (365 nm), KrF excimer laser (248 nm), $F_2$ laser (157 nm), $Kr_2$ laser (146 nm), $Ar_2$ laser (126 nm), and so on. The light source device 12 may also be a light source capable of supplying a harmonic obtained by amplifying a single wavelength laser beam in the infrared region or in the visible region lased from a DFB semiconductor laser or a fiber laser, for example, by a fiber amplifier doped with erbium (or with both of erbium and ytterbium) and effecting wavelength conversion thereof into ultraviolet light by means of a nonlinear optical crystal.

A unit in which the transmission filter and the rotation mechanism are integrated is called a transmission filter unit in some cases.

Figure 16:
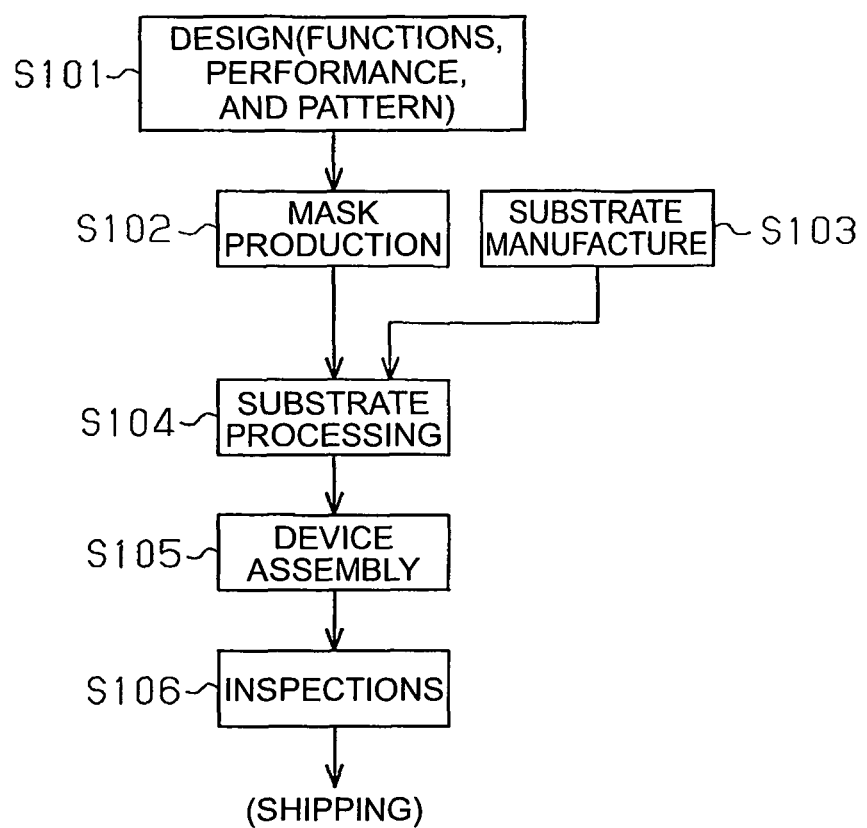
FIG. 16 is an exemplary flowchart of a device manufacturing example.

The following will describe an embodiment of a microdevice manufacturing method using the device manufacturing method with the exposure apparatus 11 in the embodiment, in a lithography process. FIG. 16 is an exemplary drawing showing a flowchart of a manufacture example of microdevices (semiconductor chips such as IC and LSI, liquid crystal panels, CCDs, thin film magnetic heads, micromachines, and so on).

First, block S101 (design block) is to design functions and performance of microdevices (e.g., circuit design of semiconductor devices or the like) and to design a pattern for realizing the functions. Subsequently, block S102 (mask production block) is to produce a mask (reticle R or the like) on which the designed circuit pattern is formed. On the other hand, block S103 (substrate manufacturing block) is to manufacture a substrate using a material such as silicon, glass, or ceramics (which is a wafer W in the case of the silicon material being used).

Next, block S104 (substrate processing block) is to form an actual circuit and others on the substrate by the lithography technique and others, as described below, using the mask and substrate prepared in blocks S101-S104. Thereafter, block S105 (device assembly block) is to assemble devices, using the substrate processed in block S104. This block S105 includes blocks such as a dicing block, a bonding block, and a packaging block (chip encapsulation) on an as-needed basis. Finally, block S106 (inspection block) is to perform inspections such as an operation check test and a durability test of microdevices fabricated in block S105. The microdevices are completed through these blocks and then they are shipped.

Figure 17:
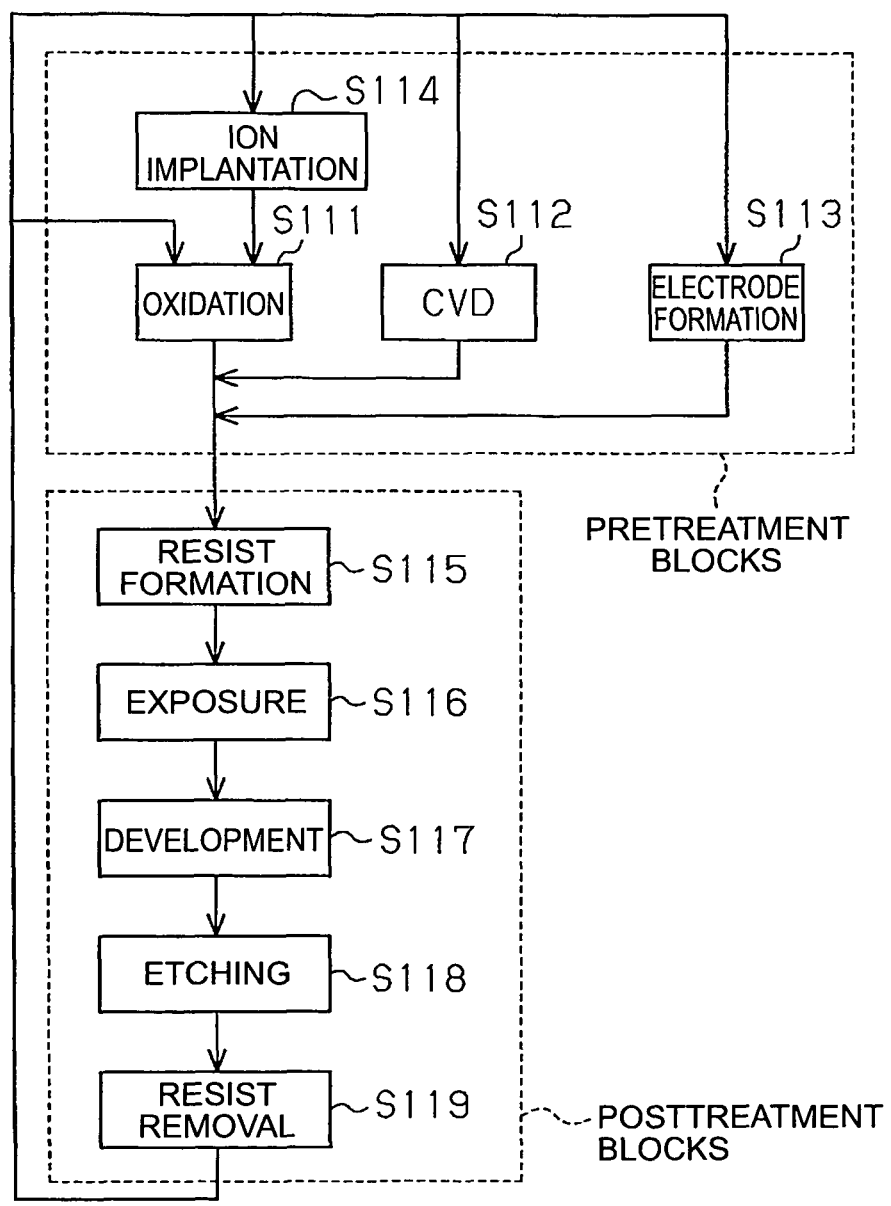
FIG. 17 is an exemplary detailed flowchart about processing of a substrate in the case of semiconductor devices.

FIG. 17 is an exemplary drawing showing an example of the detailed blocks of block S104 in the case of semiconductor devices.

Block S111 (oxidation block) is to oxidize the surface of the substrate. Block S112 (CVD block) is to form an insulating film on the surface of the substrate. Block S113 (electrode forming block) is to form electrodes on the substrate by evaporation. Block S114 (ion implantation block) is to implant ions into the substrate. Each of the above blocks S111-S114 constitutes a pretreatment block at each stage of the substrate processing and is selectively executed according to a process necessary at each stage.

After the above-described pretreatment blocks are completed at the respective stages of substrate processing, posttreatment blocks are carried out as described below. In the posttreatment blocks, first, block S115 (resist forming block) is to apply a photosensitive material onto the substrate. Subsequently, block S116 (exposure block) is to transfer the circuit pattern of the mask onto the substrate by the lithography system (exposure apparatus 11) described above. Next, block S117 (development block) is to develop the substrate exposed in block S116 and thereby to form a mask layer consisting of the circuit pattern on the surface of the substrate. Subsequently, block S118 (etching block) is to perform etching to remove the exposed material from the part other than the part on which the resist remains. Thereafter, block S119 (resist removing block) is to remove the photosensitive material unnecessary after completion of the etching. Namely, blocks S118 and S119 are to process the surface of the substrate through the mask layer. These pretreatment blocks and posttreatment blocks are repeatedly carried out, thereby forming multiple circuit patterns on the substrate.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present {TITLE} is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims.

No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:

1. An illumination optical system for illuminating an illumination target surface with light from a light source, comprising:
   an optical integrator which distributes the light from the light source on an illumination pupil plane in an illumination optical path of the illumination optical system;
   a transmission section which is arranged on the illumination pupil plane, the transmission section having a transmittance characteristic varying according to positions of the light incident thereinto; and
   a movement mechanism which moves the transmission section along an optical-axis direction of the illumination optical system in said illumination pupil plane,
   wherein the transmission section comprises a first transmission part arranged in an optical path of a first illumination beam passing through a first region in the illumination pupil plane, and a second transmission part arranged in an optical path of a second illumination beam passing through a second region in the illumination pupil plane, the second region being different from the first region.

2. The illumination optical system according to claim 1, wherein the movement mechanism has a drive source to move the transmission section along the optical-axis direction.

3. The illumination optical system according to claim 2, further comprising:
   a measuring device which measures a light intensity distribution in angular directions of a beam arriving at a predetermined point on the illumination target surface; and
   a control unit which controls the drive source in accordance with a measurement result by the measuring device.

4. The illumination optical system according to claim 1, wherein the first transmission part and the second transmission part are arranged along the optical-axis direction.

5. The illumination optical system according to claim 1, wherein the first transmission part and the second transmission part are arranged on both sides of an imaginary division plane including the optical axis.

6. The illumination optical system according to claim 5, wherein a first beam passing at a predetermined angle relative to the optical axis of the illumination optical system through the first region in the illumination pupil plane and a second beam passing at the predetermined angle relative to the optical axis of the illumination optical system through the second region in the illumination pupil plane arrive at a point on the illumination target surface, and
   wherein the first beam passes through the first transmission filter and the second beam passes through the second transmission filter.

7. The illumination optical system according to claim 1, wherein the first transmission part and the second transmission part are comprised of separate members.

8. The illumination optical system according to claim 1, wherein the transmission section has a first pattern region located in an optical path of the first illumination beam passing through the first region in the illumination pupil plane and having a first transmittance distribution, and a second pattern region located in an optical path of the second illumination beam passing through the second region in the illumination pupil plane and having a second transmittance distribution, the second region being different from the first region.

9. The illumination optical system according to claim 8, wherein the first pattern region and the second pattern region are arranged on both sides of an imaginary division plane including the optical axis of the illumination optical system.

10. The illumination optical system according to claim 9, wherein a first beam passing at a predetermined angle relative to the optical axis through the first region in the illumination pupil plane and a second beam passing at the predetermined angle relative to the optical axis of the illumination optical system through the second region in the illumination pupil plane arrive at a point on the illumination target surface, and
    wherein the first beam passes through the first pattern region and the second beam passes through the second pattern region.

11. The illumination optical system according to claim 8, wherein the first transmittance distribution of the first pattern region and the second transmittance distribution of the second pattern are identical with each other.

12. The illumination optical system according to claim 8, wherein the first pattern region and the second pattern region are formed in an identical optically transparent member.

13. The illumination optical system according to claim 1, wherein the first region and the second region in the illumination pupil plane are formed on both sides of an imaginary division line passing the optical axis of the illumination optical system in the illumination pupil plane.

14. The illumination optical system according to claim 1, wherein a first ray emerging from a predetermined point in the illumination pupil plane and arriving at a first point in one region resulting from division with an imaginary division line passing the optical axis of the illumination optical system on the illumination target surface and a second ray emerging from the predetermined point in the illumination pupil plane and arriving at a second point in the other region on the illumination target surface pass through one partial region out of a plurality of regions resulting from division by imaginary division lines passing the optical axis in the transmission section.

15. The illumination optical system according to claim 1, wherein a ratio of a minimum diameter of a region where a beam emerging from a predetermined point in the illumination pupil plane can illuminate the transmission section, to an effective diameter of the transmission section is more than ½ in a movable range in the optical-axis direction of the transmission.

16. The illumination optical system according to claim 1, wherein the movement mechanism is configured so as to be able to move the transmission section along a direction intersecting with the optical-axis direction.

17. The illumination optical system according to claim 1, wherein an irradiated region formed on the illumination target surface by light emitted from the illumination optical system has a shape longer in a first direction on the illumination target surface than in a second direction intersecting with the first direction, and wherein the transmission section is formed with mutually different transmittance characteristics at respective positions in a predetermined direction corresponding to the first direction in the transmission filter.

18. The illumination optical system according to claim 17, wherein the optical integrator is configured with divergence angles of light emitted on the illumination target surface side such that a divergence angle in a direction corresponding to the first direction is larger than a divergence angle corresponding to the second direction.

19. The illumination optical system according to claim 1, wherein the optical integrator has a plurality of unit wavefront division faces arrayed in a surface intersecting with the optical axis.

20. The illumination optical system according to claim 1, wherein the illumination optical system is used in combination with a projection optical system for forming a plane optically conjugate with the illumination target surface, and
wherein the illumination pupil plane is formed at a position optically conjugate with an aperture stop of the projection optical system.

21. An exposure apparatus comprising the illumination optical system as set forth in claim 1 for guiding the light emitted from the light source to a predetermined pattern on the illumination target surface,
wherein an image of a pattern formed by illuminating the predetermined pattern with the light emitted from the illumination optical system is projected onto a substrate coated with a photosensitive material.

22. The exposure apparatus according to claim 21, further comprising a projection optical system for projecting the image of the pattern onto the substrate,
wherein the image of the pattern is projected onto the substrate with relative movement of the pattern and the substrate along a scanning direction relative to the projection optical system.

23. A device manufacturing method comprising:
effecting exposure to print the image of the pattern on a surface of the substrate, using the exposure apparatus as set forth in claim 21;
developing the substrate to form a mask layer in a shape corresponding to the image of the pattern on the surface of the substrate; and
processing the surface of the substrate through the mask layer.

24. An illumination optical system for illuminating an illumination target surface with light from a light source, comprising:
an optical integrator which distributes the light from the light source on an illumination pupil plane in an illumination optical path of the illumination optical system;
a transmission section which is arranged on the illumination pupil plane, the transmission section having a transmittance characteristic varying according to positions of the light incident thereinto; and
a movement mechanism which moves the transmission section along an optical-axis direction of the illumination optical system.

25. A device manufacturing method comprising:
illuminating a pattern;
effecting exposure to print the image of the pattern on a surface of the substrate, using the illumination optical system as set forth in claim 24;
developing the substrate to form a mask layer in a shape corresponding to the image of the pattern on the surface of the substrate; and
processing the surface of the substrate through the mask layer.

26. An illumination optical system for illuminating an illumination target surface with light from a light source, comprising:
an optical integrator which distributes the light from the light source on an illumination pupil plane in an illumination optical path of the illumination optical system;
a transmission section which is arranged on the illumination pupil plane, the transmission section having a transmittance characteristic varying according to positions of the light incident thereinto; and
a movement mechanism which moves the transmission section along an optical-axis direction of the illumination optical system,
wherein the transmission section comprises a plurality of transmission parts arranged along the optical-axis direction.

27. A device manufacturing method comprising:
illuminating a pattern;
effecting exposure to print the image of the pattern on a surface of the substrate, using the illumination optical system as set forth in claim 26;
developing the substrate to form a mask layer in a shape corresponding to the image of the pattern on the surface of the substrate; and
processing the surface of the substrate through the mask layer.

28. An illumination method for illuminating an illumination target surface with light from a light source, comprising:
distributing the light from the light source on an illumination pupil plane in an illumination optical path of the illumination optical system, by using an optical integrator;
arranging a transmission section on the illumination pupil plane, the transmission section having a transmittance characteristic varying according to positions of the light incident thereinto; and
moving the transmission section along an optical-axis direction of the illumination optical system in said illumination pupil plane,
wherein the transmission section comprises a first transmission part arranged in an optical path of a first illumination beam passing through a first region in the illumination pupil plane, and a second transmission part arranged in an optical path of a second illumination beam passing through a second region in the illumination pupil plane, the second region being different from the first region.

29. A device manufacturing method comprising:
illuminating a pattern;
effecting exposure to print the image of the pattern on a surface of the substrate, using the illumination method as set forth in claim 28;
developing the substrate to form a mask layer in a shape corresponding to the image of the pattern on the surface of the substrate; and
processing the surface of the substrate through the mask layer.

30. An illumination method for illuminating an illumination target surface with light from a light source, comprising:
distributing the light from the light source on an illumination pupil plane in an illumination optical path of the illumination optical system, by using an optical integrator;

arranging a transmission section on the illumination pupil plane, the transmission section having a transmittance characteristic varying according to positions of the light incident thereinto; and moving the transmission section along an optical-axis direction of the illumination optical system.

31. A device manufacturing method comprising:

illuminating a pattern;

effecting exposure to print the image of the pattern on a surface of the substrate, using the illumination method as set forth in claim 30;

developing the substrate to form a mask layer in a shape corresponding to the image of the pattern on the surface of the substrate; and processing the surface of the substrate through the mask layer.

32. An illumination method for illuminating an illumination target surface with light from a light source, comprising:

distributing the light from the light source on an illumination pupil plane in an illumination optical path of the illumination optical system, by using an optical integrator;

arranging a transmission section on the illumination pupil plane side with respect to the optical integrator, the transmission section having a transmittance characteristic varying according to positions of the light incident thereinto; and moving the transmission section along an optical-axis direction of the illumination optical system, wherein the transmission section comprises a plurality of transmission parts arranged along the optical-axis direction.

33. A device manufacturing method comprising:

illuminating a pattern;

effecting exposure to print the image of the pattern on a surface of the substrate, using the illumination method as set forth in claim 32;

developing the substrate to form a mask layer in a shape corresponding to the image of the pattern on the surface of the substrate; and processing the surface of the substrate through the mask layer.

\* \* \* \* \*